US011450031B2

(12) United States Patent
Flynn

(10) Patent No.: US 11,450,031 B2
(45) Date of Patent: Sep. 20, 2022

(54) SIGNIFICANT COEFFICIENT FLAG ENCODING FOR POINT CLOUD ATTRIBUTE COMPRESSION

(71) Applicant: Apple Inc., Cupertino, CA (US)

(72) Inventor: David Flynn, Munich (DE)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/230,852

(22) Filed: Apr. 14, 2021

(65) Prior Publication Data

US 2021/0319593 A1 Oct. 14, 2021

Related U.S. Application Data

(60) Provisional application No. 63/009,967, filed on Apr. 14, 2020.

(51) Int. Cl.
*G06T 9/00* (2006.01)
*H03M 7/30* (2006.01)
*H03M 7/46* (2006.01)
*H03M 7/40* (2006.01)

(52) U.S. Cl.
CPC ........... *G06T 9/001* (2013.01); *H03M 7/4075* (2013.01); *H03M 7/46* (2013.01); *H03M 7/6011* (2013.01)

(58) Field of Classification Search
CPC ....... G06T 9/001; H03M 7/4075; H03M 7/46; H03M 7/6011; H03M 7/6029; H03M 7/70; H03M 7/40
See application file for complete search history.

(56) References Cited

U.S. PATENT DOCUMENTS

| | | | |
|---|---|---|---|
| 9,300,321 B2 * | 3/2016 | Zalik | H03M 7/3075 |
| 2019/0081638 A1 * | 3/2019 | Mammou | H03M 7/3059 |
| 2020/0302651 A1 | 9/2020 | Flynn et al. | |
| 2021/0104073 A1 | 4/2021 | Yea et al. | |
| 2021/0105504 A1 | 4/2021 | Hur et al. | |

* cited by examiner

*Primary Examiner* — Khai M Nguyen
(74) *Attorney, Agent, or Firm* — Alexander A. Knapp; Kowert, Hood, Munyon, Rankin & Goetzel, P.C.

(57) ABSTRACT

A system comprises an encoder configured to compress attribute information for a point cloud and/or a decoder configured to decompress compressed attribute information for the point cloud. To compress the attribute information, a transform is applied to the attribute values to generate attribute coefficients/transformed attribute values. Points with attribute coefficients with a significant value are assigned a first binary flag value, while points with non-significant attribute coefficients are assigned a second binary flag value. A $K^{th}$ order exponential Golomb encoder or Golomb-Rice encoder is used to compress the run-length values, where separate states and associated contexts are maintained for funs of both the first and second binary values. A decoder uses a corresponding process to decode the compressed attribute information.

20 Claims, 21 Drawing Sheets

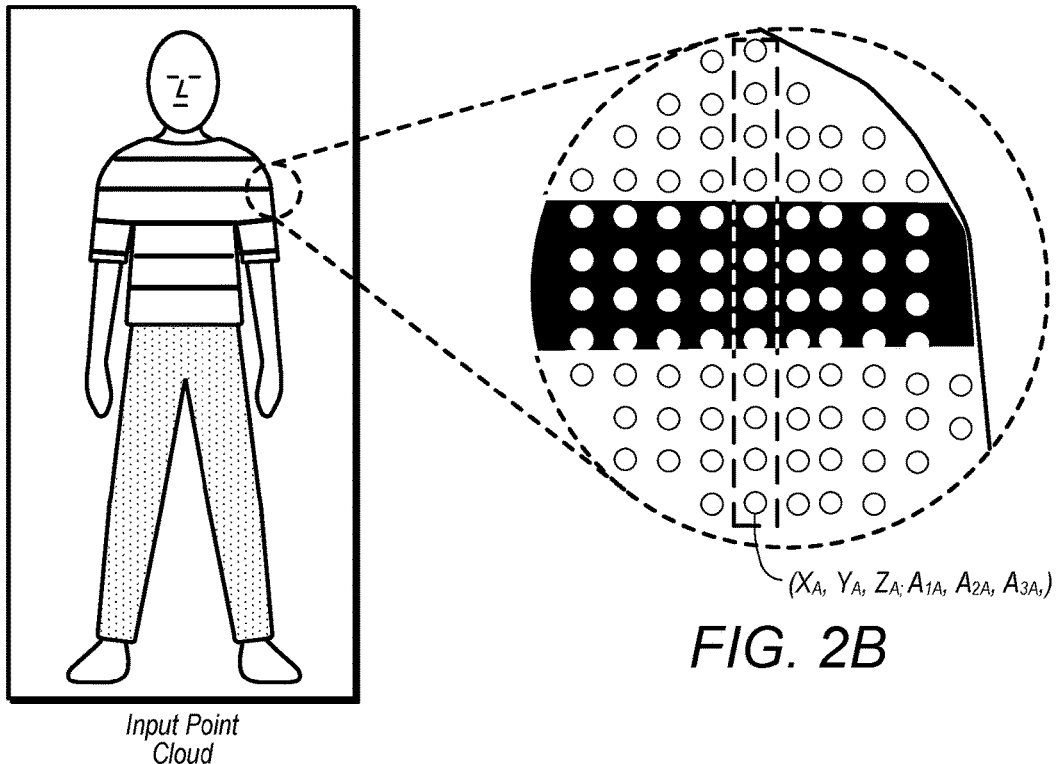
Input Point Cloud
FIG. 2A
FIG. 2B
$(X_A, Y_A, Z_A, A_{1A}, A_{2A}, A_{3A},)$
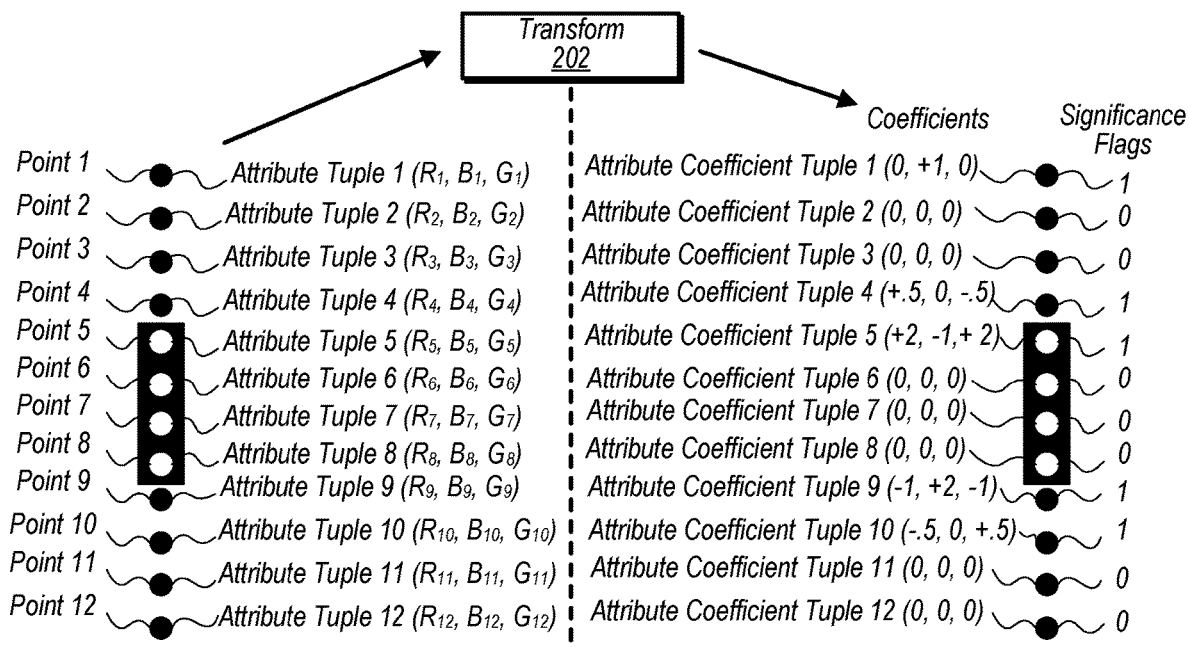
FIG. 2C
FIG. 2D

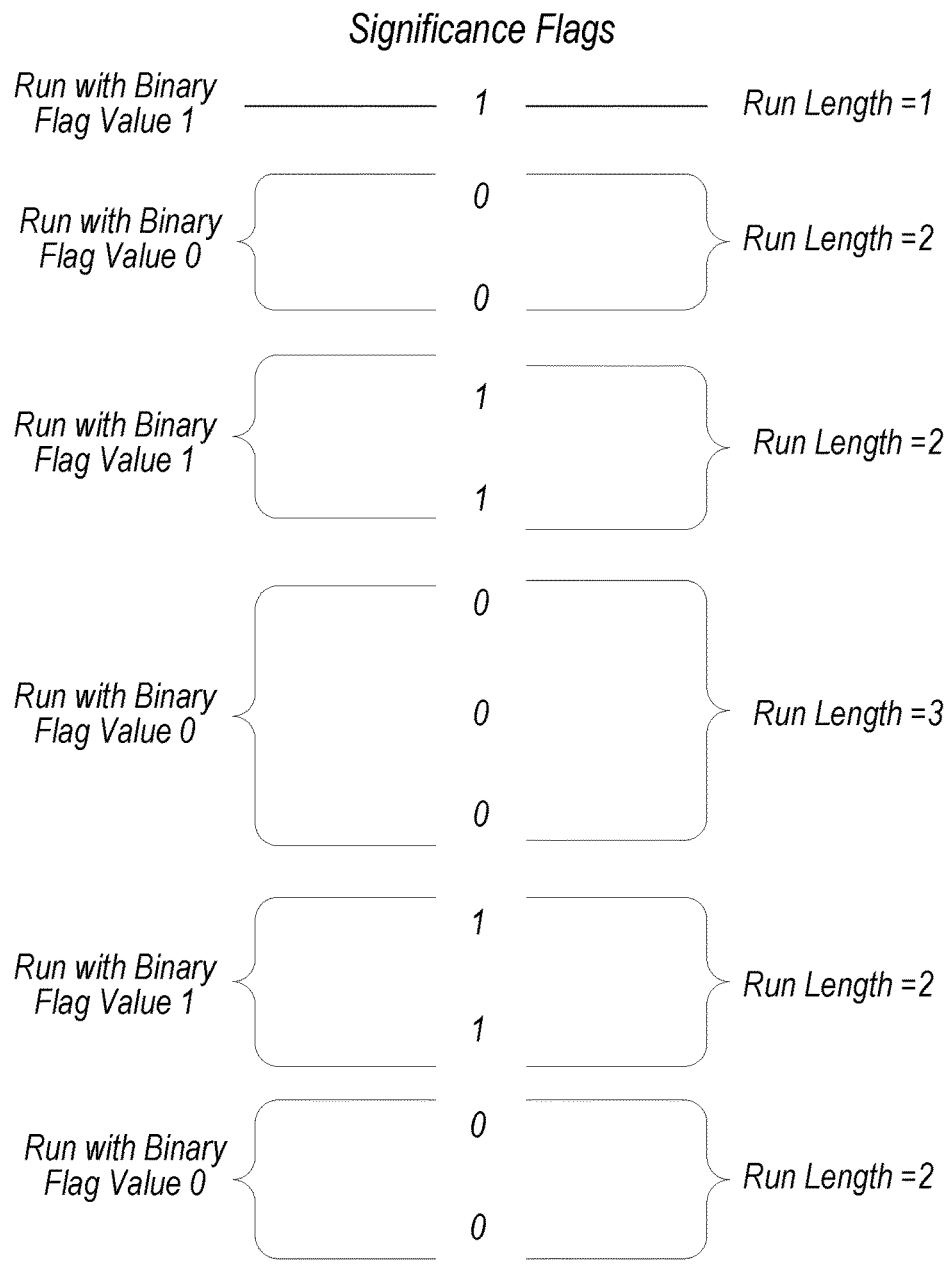

FIG. 2E

Run-length values to be encoded using variable-length encoder and to be included in bit stream in alternating sequence based on binary flag value

Run-length values to be encoded using variable-length encoder and to be included in bit stream in alternating sequence based on binary flag value, with starting run binary value signaled First run=Binary Flag Value=1
0...1...1...2...1...1

FIG. 2G

Compressed Attribute Information File — 700

---

Configuration Information — 702
- K   (Number of nearest neighbors to identify)
- C   (Context encoding configuration(s))
- AI  (Additional configuration information)

---

Point Cloud Data
Attribute Information for Starting Points
$(X_A, Y_A, Z_A; A_{1A}, A_{2A}, A_{3A},); (Point\ N, A_{1N}, A_{2N}, A_{3N},), \dots$ — 704

---

Point Attribute Correction Values — 706

- Run Length Values (starting with first binary value)
    (1...2...2...3...2...2)

- Coefficient Values for Points with Significant Tuples

| Significant Points | Coefficient Values |
|---|---|
| Point 1 | Attribute 1 — 0<br>Attribute 2 — +1<br>Attribute 3 — 0 |
| Point 4 | Attribute 1 — +0.5<br>Attribute 2 — 0<br>Attribute 3 — -0.5 |
| Point 5 | Attribute 1 — +2<br>Attribute 2 — -1<br>Attribute 3 — +2 |
| Point 9 | Attribute 1 — -1<br>Attribute 2 — +2<br>Attribute 3 — -1 |
| Point 10 | Attribute 1 — -0.5<br>Attribute 2 — 0<br>Attribute 3 — +0.5 |

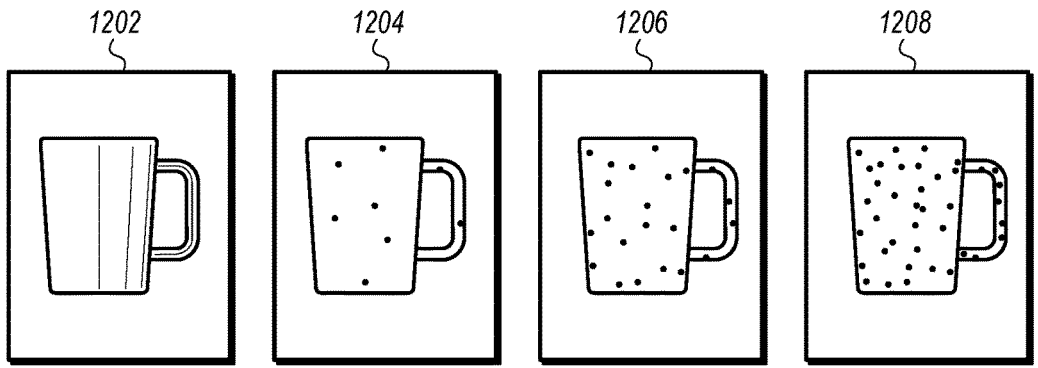

Level of Details →

FIG. 12A

Compressed Attribute Information File    1250

| Configuration Information | 1252 |
|---|---|
| N (Number of Levels of Detail)<br>S (Level of Detail Initial Sampling Distance)<br>F (Sampling Distance Update Factor)<br>K (Number of nearest neighbors to identify)<br>C (Context encoding configuration(s))<br>AI (Additional configuration information) | |

| Point Cloud Data | 1254 |
|---|---|
| Attribute Information for Starting Points<br>$(X_A, Y_A, Z_A; A_{1A}, A_{2A}, A_{3A},);$ (Point N, $A_{1N}, A_{2N}, A_{3N},$), ... | |

| Point Attribute Correction Values LOD1 | 1256 |
|---|---|
| - Run Lengths Values (1...1... ...)<br>-Significant Attribute Points for LOD1 | |

Point A           Attribute 1 — +1
                         Attribute 2 — -1
                         Attribute 3 — 0

Point B           Attribute 1 — +2
                         Attribute 2 — -2

Point Attribute Correction Values LOD2
-Run Length Values (2...0... ...)
-Significant Attribute Points for LOD2

Point C           Attribute 1 — +2
                         Attribute 2 — -3

Point D           Attribute 1 — +1
                         Attribute 2 — 0
                         Attribute 3 — -2

FIG. 12B

Direct Transform

Inverse Transform

SIGNIFICANT COEFFICIENT FLAG ENCODING FOR POINT CLOUD ATTRIBUTE COMPRESSION

PRIORITY CLAIM

This application claims benefit of priority to U.S. Provisional Application Ser. No. 63/009,967, entitled "SIGNIFICANT COEFFICIENT FLAG ENCODING FOR POINT CLOUD ATTRIBUTE COMPRESSION", filed Apr. 14, 2020, and which is incorporated herein by reference in its entirety.

BACKGROUND

Technical Field

This disclosure relates generally to compression and decompression of point clouds or other three-dimensional representations comprising a plurality of points, each having associated attribute information.

Description of the Related Art

Various types of sensors, such as light detection and ranging (LIDAR) systems, 3-D-cameras, 3-D scanners, etc. may capture data indicating positions of points in three dimensional space, for example positions in the X, Y, and Z planes. Also, such systems may further capture attribute information in addition to spatial information for the respective points, such as color information (e.g. RGB values), intensity attributes, reflectivity attributes, motion related attributes, modality attributes, or various other attributes. In some circumstances, additional attributes may be assigned to the respective points, such as a time-stamp when the point was captured. Points captured by such sensors may make up a "point cloud" or other three-dimensional representation comprising a set of points each having associated spatial information and one or more associated attributes. In some circumstances, such a set of points may include thousands of points, hundreds of thousands of points, millions of points, or even more points. Also, in some circumstances, such a set of points may be generated, for example in software, as opposed to being captured by one or more sensors. In either case, such sets of points, such in a point cloud, may include large amounts of data and may be costly and time-consuming to store and transmit.

SUMMARY OF EMBODIMENTS

In some embodiments, a system includes one or more sensors configured to capture points that collectively make up a set of points for which attribute values are to be compressed, such as points of a point cloud, vertices of a mesh, etc. Each of the points comprises spatial information identifying a spatial location of the respective point in 3D space and attribute information defining one or more attributes associated with the respective point.

The system also includes an encoder configured to compress the attribute information for the points. To compress the attribute information, the encoder is configured to organize the points of the set of points into an order based on respective spatial positions of the plurality of points in 3D space. For example, in some embodiments, a space filling curve may be used to determine an ordering of the points. The encoder is also configured to perform one or more transforms on the attribute values of the points in order to compress the attribute information. For example, the encoder may utilize a prediction based transform, a lifting scheme transform, a region-adaptive hierarchical transform, or other suitable transform to compact energy from the source signal by removing redundant low frequency information, and optionally quantizing high frequency information.

As an example, in a prediction based transform an attribute value is assigned to at least one point of the set of points based on the attribute information included in the captured set of points, such as a captured point cloud. Additionally, to perform the prediction based transform, the encoder is configured to, for each of respective other ones of the points of the set of points, identify a set of neighboring points, determine a predicted attribute value for the respective point based, at least in part, on predicted or assigned attributes values for the neighboring points, and determine, based, at least in part, on comparing the predicted attribute value for the respective point to the attribute information for the point included in the captured set of points, an attribute correction value for the point. The encoder is further configured to encode the assigned attribute value for the at least one point and data indicating, for the respective other ones of the points, the respective determined attribute correction values. The determined attribute correction values are the result of applying the prediction transform and are referred to herein as attribute coefficients/transformed attribute values. As mentioned above, in some embodiments, other transforms may be applied to generate attribute coefficients/transformed attribute values, such as a lifting transform or region-adaptive hierarchical transform (RAHT), as a few examples.

In some embodiments, an encoder is further configured to determine, for each point of the set of points, whether respective values of one or more transformed attribute values associated with the respective point comprise one or more significant values or do not comprise a significant value. For example, some attributes such as color may be represented as an attribute tuple for each point, wherein the attribute tuple includes attribute values for multiple color components associated with the respective point, such as red, blue, and green color values. If the transformed color values (e.g. attribute correction values resulting from a prediction based transform or other transform) have significant values, such as a non-zero correction value for red, blue, or green, the points may be determined to have significant transformed attribute values. However, if all the transformed color values for a given point have non-significant values, such as correction values for red, blue, and green all equal to zero, the given point may be determined to have non-significant transformed attribute values. Note, that in various embodiments other thresholds, other than greater than zero, may be used to distinguish between significant and non-significant transformed attribute values.

The encoder is further configured to assign to points that have transformed attribute values that comprise one or more significant values a first binary flag value and assign to points that have transformed attribute values that do not comprise a significant value a second binary flag value. Additionally, the encoder is configured to evaluate the binary flag values assigned to the points of the set of points to identify consecutive points assigned the first binary flag value and consecutive points assigned the second binary flag value. Also, for respective runs of points having the first binary flag value as a same assigned binary flag value and for respective runs of points having the second binary flag value as a same assigned binary flag value, the encoder is configured to encode a value indicating a length of the respective run using a variable-length encoding technique.

In some embodiments, the variable length encoding technique used, may be a $k^{th}$ order exponential Golomb encoding technique. In such embodiments, the encoder is further configured to maintain a first state for determining a value of k for respective runs having the first binary flag value as a same assigned binary flag value and maintain a second state for determining a value of k for respective runs having the second binary flag value as a same assigned binary flag value. Additionally, the encoder is configured to maintain contexts and associated probabilities for determining pre-fix portions of Golomb code words for the $k^{th}$ order Golomb encoding technique, wherein whether a run-length value being encoded is for a respective run having the first binary flag value as a same assigned binary flag value or the second binary flag value as a same assigned binary flag value is one of the contexts that is maintained.

In some embodiments, a system includes a decoder configured to receive a sequence of encoded run-length values, encoded using a variable length encoding technique, such as is included in compressed attribute information generated by an encoder as described above. The decoder is configured to decode the encoded values using a variable length decoding technique to determine respective run lengths of the respective runs. Also, for respective runs having a first binary flag value as a same assigned binary flag value, the decoder is configured to mark the points associated with the respective runs for further processing to determine attribute values for the points of the respective runs and for other respective runs having the second binary flag value as a same assigned binary flag value, the decoder is configured to assign a zero value to the attributes coefficients for the points associated with the other respective runs.

The decoder may further process the marked points and include the attribute coefficients determined for the marked points along with the zero value attribute coefficients for the other points in a set of attribute information for set of points whose attribute information is being decompressed.

In some embodiments, wherein a prediction based transform is used, the attribute information resulting from said marking and said assigning zero values may further comprise at least one assigned attribute value for at least one point of the set of points and the determined attribute coefficients/transformed attribute values, for other points of the set of points. The determined attribute coefficients/transformed attribute values may be respective attribute correction values for respective attributes of the other points. The decoder may further be configured to, for each of respective other ones of the points of the set of points other than the at least one point with assigned attribute values, identify a set of neighboring points to a point being evaluated, determine a predicted attribute value for the point being evaluated based, at least in part, on predicted or assigned attribute values for the neighboring points, and adjust the predicted attribute value for the point being evaluated based, at least in part, on an attribute correction value for the point included in the compressed attribute information. The decoder may be further configured to provide attribute information for a decompressed point cloud that is being reconstructed, the attribute information comprising the at least one assigned attribute value for the at least one point and the adjusted predicted attribute values for the other ones of the points.

In some embodiments, a non-transitory computer-readable medium stores program instructions, that when executed by one or more processors, cause the one or more processors to implement an encoder or decoder as described herein.

In some embodiments, a method comprises steps for encoding or decoding a set of points as performed by the encoder and/or the decoder, as described herein.

BRIEF DESCRIPTION OF THE DRAWINGS

FIG. 2A illustrates an example point cloud for which attribute information, such as color information, is to be compressed, according to some embodiments.

FIG. 2B illustrates a closer view of the points for which the attribute information is to be compressed, according to some embodiments.

FIG. 2C illustrates points having associated attribute tuples, wherein the attribute information for the points is to be compressed, according to some embodiments.

FIG. 2D illustrates points having associated attribute coefficients resulting from applying a transform operation to the attribute values associated with the points, according to some embodiments.

FIG. 2E illustrates significance flags assigned to points whose attribute value information is being compressed, according to some embodiments.

FIG. 2F illustrates a sequence of run-length values to be included in a bit-stream for a set of points whose attribute value information is being compressed, according to some embodiments.

FIG. 2G illustrates a sequence of run-length values to be included in a bit-stream for a set of points whose attribute value information is being compressed, wherein the binary flag value of the first run is signaled, according to some embodiments.

FIG. 7 illustrates an example compressed attribute file, according to some embodiments.

FIG. 12A illustrates an example level of detail (LOD) structure, according to some embodiments.

FIG. 12B illustrates an example compressed point cloud file comprising level of details (LODs) for a set of points, such as a point cloud, according to some embodiments.

Figure 1A:
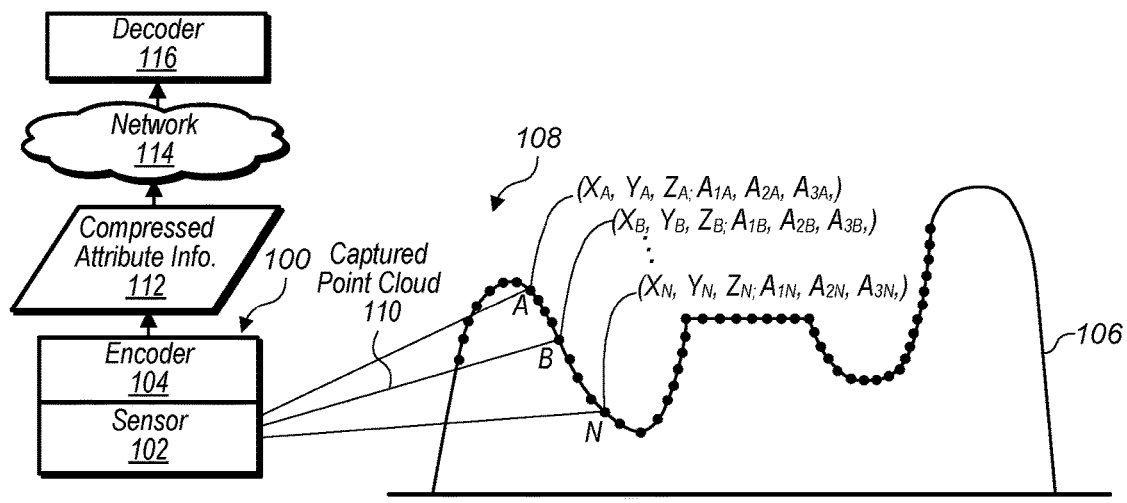
FIG. 1A illustrates a system comprising a sensor that captures information for points of a point cloud and an encoder that compresses attribute information and/or spatial information of the point cloud, where the compressed point cloud information is sent to a decoder, according to some embodiments.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

"Comprising." This term is open-ended. As used in the appended claims, this term does not foreclose additional structure or steps. Consider a claim that recites: "An apparatus comprising one or more processor units . . . " Such a claim does not foreclose the apparatus from including additional components (e.g., a network interface unit, graphics circuitry, etc.).

"Configured To." Various units, circuits, or other components may be described or claimed as "configured to" perform a task or tasks. In such contexts, "configured to" is used to connote structure by indicating that the units/circuits/components include structure (e.g., circuitry) that performs those task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. § 112(f), for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configure to" may also include adapting a manufacturing process (e.g., a semiconductor fabrication facility) to fabricate devices (e.g., integrated circuits) that are adapted to implement or perform one or more tasks.

"First," "Second," etc. As used herein, these terms are used as labels for nouns that they precede, and do not imply any type of ordering (e.g., spatial, temporal, logical, etc.). For example, a buffer circuit may be described herein as performing write operations for "first" and "second" values. The terms "first" and "second" do not necessarily imply that the first value must be written before the second value.

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

DETAILED DESCRIPTION

As data acquisition and display technologies have become more advanced, the ability to capture sets of points comprising thousands or millions of points in 2-D or 3-D space, such as via LIDAR systems, has increased. Also, the development of advanced display technologies, such as virtual reality or augmented reality systems, has increased potential uses for large sets of points, such as in point clouds. However, files for such sets of points are often very large and may be costly and time-consuming to store and transmit. For example, communication of point clouds over private or public networks, such as the Internet, may require considerable amounts of time and/or network resources, such that some uses of point cloud data, such as real-time uses, may be limited. Also, storage requirements flies comprising large sets of points, such as point cloud files, may consume a significant amount of storage capacity of devices storing the files, which may also limit potential applications for using point cloud data.

In some embodiments, an encoder may be used to generate a compressed file to reduce costs and time associated with storing and transmitting large sets of points, such as in point cloud files. In some embodiments, a system may include an encoder that compresses attribute information and/or spatial information (also referred to herein as geometry information) of a set of points such that the file may be stored and transmitted more quickly than non-compressed files and in a manner such that the file may occupy less storage space than non-compressed files. In some embodiments, compression of spatial information and/or attributes of points in a set of points may enable a file to be communicated over a network in real-time or in near real-time. For example, a system may include a sensor that captures spatial information and/or attribute information about points in an environment where the sensor is located, wherein the captured points and corresponding attributes make up a point cloud. The system may also include an encoder that compresses the captured point cloud attribute information. The compressed attribute information of the point cloud may be sent over a network in real-time or near real-time to a decoder that decompresses the compressed attribute information of the point cloud. The decompressed point cloud may be further processed, for example to make a control decision based on the surrounding environment at the location of the sensor. The control decision may then be communicated back to a device at or near the location of the sensor, wherein the device receiving the control decision implements the control decision in real-time or near real-time. In some embodiments, the decoder may be associated with an augmented reality system and the decompressed attribute information may be displayed or otherwise used by the augmented reality system. In some embodiments, compressed attribute information for a point cloud may be sent with compressed spatial information for points of the point cloud. In other embodiments, spatial information and attribute information may be separately encoded and/or separately transmitted to a decoder.

In some embodiments, a system may include a decoder that receives one or more files comprising compressed attribute information for a large set of points via a network from a remote server or other storage device that stores the one or more files. For example, a 3-D display, a holographic display, or a head-mounted display may be manipulated in real-time or near real-time to show different portions of a virtual world represented by point clouds. In order to update the 3-D display, the holographic display, or the head-mounted display, a system associated with the decoder may request files from the remote server based on user manipulations of the displays, and the files may be transmitted from the remote server to the decoder and decoded by the decoder in real-time or near real-time. The displays may then be updated with updated data responsive to the user manipulations, such as updated point attributes.

In some embodiments, a system, may include one or more LIDAR systems, 3-D cameras, 3-D scanners, etc., and such sensor devices may capture spatial information, such as X, Y, and Z coordinates for points in a view of the sensor devices. In some embodiments, the spatial information may be relative to a local coordinate system or may be relative to a global coordinate system (for example, a Cartesian coordinate system may have a fixed reference point, such as a fixed point on the earth, or may have a non-fixed local reference point, such as a sensor location).

In some embodiments, such sensors may also capture attribute information for one or more points, such as color attributes, reflectivity attributes, velocity attributes, acceleration attributes, time attributes, modalities, and/or various other attributes. In some embodiments, other sensors, in addition to LIDAR systems, 3-D cameras, 3-D scanners, etc., may capture attribute information to be included in a set of points, such as in a point cloud. For example, in some embodiments, a gyroscope or accelerometer, may capture motion information to be included in a point cloud as an attribute associated with one or more points of the point cloud.

In some embodiments, attribute information may comprise string values, such as different modalities. For example attribute information may include string values indicating a modality such as "walking", "running", "driving", etc. In some embodiments, an encoder may comprise a "string-value" to integer index, wherein certain strings are associated with certain corresponding integer values. In some embodiments, a set of points may indicate a string value for a point by including an integer associated with the string value as an attribute of the point. The encoder and decoder may both store a common string value to integer index, such that the decoder can determine string values for points based on looking up the integer value of the string attribute of the point in a string value to integer index of the decoder that matches or is similar to the string value to integer index of the encoder.

In some embodiments, an encoder compresses and encodes spatial information of a point cloud to compress the spatial information in addition to compressing attribute information for attributes of the points of the point cloud. For example, to compress spatial information a K-D tree may be generated wherein, respective numbers of points included in each of the cells of the K-D tree are encoded. This sequence of encoded point counts may encode spatial information for points of a point cloud. Also, in some embodiments, a sub-sampling and prediction method may be used to compress and encode spatial information for a point cloud. In some embodiments, the spatial information may be quantized prior to being compressed and encoded. Also, in some embodiments, compression of spatial information may be lossless. Thus, a decoder may be able to determine a same view of the spatial information as an encoder. Also, for lossy encoding, an encoder may be able to determine a view of the spatial information a decoder will encounter once the compressed spatial information is decoded. Because, both an encoder and decoder may have or be able to recreate the same spatial information for the point cloud, spatial relationships may be used to compress attribute information for the point cloud.

For example, in many point clouds, attribute information between adjacent points or points that are located at relatively short distances from each other may have high levels of correlation between attributes, and thus relatively small differences in point attribute values. For example, proximate points in a point cloud may have relatively small differences in color, when considered relative to points in the point cloud that are further apart.

In some embodiments, an encoder may include various types of transforms that compact energy from a source signal by removing redundant low frequency information. For example, an encoder may include a predictor that determines a predicted attribute value of an attribute of a point in a point cloud based on attribute values for similar attributes of neighboring points in the point cloud and based on respective distances between the point being evaluated and the neighboring points. In some embodiments, attribute values of attributes of neighboring points that are closer to a point being evaluated may be given a higher weighting than attribute values of attributes of neighboring points that are further away from the point being evaluated. Also, the encoder may compare a predicted attribute value to an actual attribute value for an attribute of the point in the original point cloud prior to compression. A residual difference, also referred to herein as an "attribute correction value" may be determined based on this comparison. An attribute correction value may be encoded and included in compressed attribute information for the point cloud, wherein a decoder uses the encoded attribute correction value to correct a predicted attribute value for the point, wherein the attribute value is predicted using a same or similar prediction methodology at the decoder that is the same or similar to the prediction methodology that was used at the encoder.

In some embodiments, to encode attribute values an encoder may generate an ordering of points of a point cloud based on spatial information for the points of the point cloud. For example, the points may be ordered according a space-filling curve. In some embodiments, this ordering may represent a Morton ordering of the points. The encoder may select a first point as a starting point and may determine an evaluation order for other ones of the points of the point cloud based on minimum distances from the starting point to a closest neighboring point, and a subsequent minimum distance from the neighboring point to the next closest neighboring point, etc. Also, in some embodiments, neighboring points may be determined from a sub-group of points within a user-defined search range of an index value of a given point being evaluated, wherein the index value and the search range values are values in an index of the points of the point cloud organized according to the space filling curve. In this way, an evaluation order for determining predicted attribute values of the points of the point cloud may be determined. Because the decoder may receive or re-create the same spatial information as the spatial information used by the encoder, the decoder may generate the same ordering of the points for the point cloud and may determine the same evaluation order for the points of the point cloud.

In some embodiments, an encoder using a prediction transform may assign an attribute value for a starting point of a point cloud to be used to predict attribute values of other points of the point cloud. An encoder may predict an attribute value for a neighboring point to the starting point based on the attribute value of the starting point and a distance between the starting point and the neighboring point. The encoder may then determine a difference between the predicted attribute value for the neighboring point and the actual attribute value for the neighboring point included in the non-compressed original point cloud. This difference may be encoded in a compressed attribute information file as an attribute correction value for the neighboring point. The encoder may then repeat a similar process for each point in the evaluation order. To predict the attribute value for subsequent points in the evaluation order, the encoder may identify the K-nearest neighboring points to a particular point being evaluated, wherein the identified K-nearest neighboring points have assigned or predicted attribute values. In some embodiments, "K" may be a configurable parameter that is communicated from an encoder to a decoder.

The encoder may determine a distance in X, Y, and Z space between a point being evaluated and each of the identified neighboring points. For example, the encoder may determine respective Euclidian distances from the point being evaluated to each of the neighboring points. The encoder may then predict an attribute value for an attribute of the point being evaluated based on the attribute values of the neighboring points, wherein the attribute values of the neighboring points are weighted according to an inverse of the distances from the point being evaluated to the respective ones of the neighboring points. For example, attribute values of neighboring points that are closer to the point being evaluated may be given more weight than attribute values of neighboring points that are further away from the point being evaluated.

In a similar manner as described for the first neighboring point, the encoder may compare a predicted value for each of the other points of the point cloud to an actual attribute value in an original non-compressed point cloud, for example the captured point cloud. The difference may be encoded as an attribute correction value for an attribute of one of the other points that is being evaluated. In some embodiments, attribute correction values may be encoded in an order in a compressed attribute information file in accordance with the evaluation order determined based on the space filling curve order. Because the encoder and the decoder may determine the same evaluation order based on the spatial information for the point cloud, the decoder may determine which attribute correction value corresponds to which attribute of which point based on the order in which the attribute correction values are encoded in the compressed attribute information file. Additionally, the starting point and one or more attribute value(s) of the starting point may be explicitly encoded in a compressed attribute information file such that the decoder may determine the evaluation order starting with the same point as was used to start the evaluation order at the encoder. Additionally, the one or more attribute value(s) of the starting point may provide a value of a neighboring point that a decoder uses to determine a predicted attribute value for a point being evaluated that is a neighboring point to the starting point.

The determined attribute correction values are the result of applying the prediction transform and are referred to herein as attribute coefficients/transformed attribute values. As mentioned above, in some embodiments, other transforms may be applied to generate attribute coefficients/transformed attribute values, such as a lifting transform or region-adaptive hierarchical transform (RAHT), as a few examples.

In some embodiments, an encoder is further configured to determine, for each point of the set of points, whether respective values of one or more transformed attribute values associated with the respective point (e.g. attribute correction values) comprise one or more significant values or do not comprise a significant value. For example, some attributes such as color may be represented as an attribute tuple for each point, wherein the attribute tuple includes attribute values for multiple color components associated with the respective point, such as red, blue, and green color values. If the transformed color values (e.g. attribute correction values resulting from a prediction based transform or other transform) have significant values, such as a non-zero correction value for red, blue, or green, the points may be determined to have significant transformed attribute values. However, if all the transformed color values for a given point have non-significant values, such as correction values for red, blue, and green all equal to zero, the given point may be determined to have non-significant transformed attribute values. Note, that in various embodiments other thresholds, other than greater than zero, may be used to distinguish between significant and non-significant transformed attribute values.

The encoder is further configured to assign to points that have transformed attribute values that comprise one or more significant values a first binary flag value and assign to points that have transformed attribute values that do not comprise a significant value a second binary flag value. Additionally, the encoder is configured to evaluate the binary flag values assigned to the points of the set of points to identify consecutive points assigned the first binary flag value and consecutive points assigned the second binary flag value. Also, for respective runs of points having the first binary flag value as a same assigned binary flag value and for respective runs of points having the second binary flag value as a same assigned binary flag value, the encoder is configured to encode a value indicating a length of the respective run using a variable-length encoding technique.

In some embodiments, the variable length encoding technique used, may be a $k^{th}$ order exponential Golomb encoding technique. In such embodiments, the encoder is further configured to maintain a first state for determining a value of k for respective runs having the first binary flag value as a same assigned binary flag value and maintain a second state for determining a value of k for respective runs having the second binary flag value as a same assigned binary flag value. Additionally, the encoder is configured to maintain contexts and associated probabilities for determining pre-fix portions of Golomb code words for the $k^{th}$ order Golomb encoding technique, wherein whether a run-length value being encoded is for a respective run having the first binary flag value as a same assigned binary flag value or the second binary flag value as a same assigned binary flag value is one of the contexts that is maintained.

In some embodiments, an encoder may determine a predicted value for an attribute of a point based on temporal considerations. For example, in addition to or in place of determining a predicted value based on neighboring points in a same "frame" e.g. point in time as the point being evaluated, the encoder may consider attribute values of the point in adjacent and subsequent time frames.

FIG. 1A illustrates a system comprising a sensor that captures information for points of a point cloud and an encoder that compresses attribute information of the point cloud, where the compressed attribute information is sent to a decoder, according to some embodiments.

System 100 includes sensor 102 and encoder 104. Sensor 102 captures a point cloud 110 comprising points representing structure 106 in view 108 of sensor 102. For example, in some embodiments, structure 106 may be a mountain range, a building, a sign, an environment surrounding a street, or any other type of structure. In some embodiments, a captured point cloud, such as captured point cloud 110, may include spatial and attribute information for the points included in the point cloud. For example, point A of captured point cloud 110 comprises X, Y, Z coordinates and attributes 1, 2, and 3. In some embodiments, attributes of a point may include attributes such as R, G, B color values, a velocity at the point, an acceleration at the point, a reflectance of the structure at the point, a time stamp indicating when the point was captured, a string-value indicating a modality when the point was captured, for example "walking", or other attributes. The captured point cloud 110 may be provided to encoder 104, wherein encoder 104 generates a compressed version of the point cloud (compressed attribute information 112) that is transmitted via network 114 to decoder 116. In some embodiments, a compressed version of the point cloud, such as compressed attribute information 112, may be included in a common compressed point cloud that also includes compressed spatial information for the points of the point cloud or, in some embodiments, compressed spatial information and compressed attribute information may be communicated as separate files.

In some embodiments, encoder 104 may be integrated with sensor 102. For example, encoder 104 may be implemented in hardware or software included in a sensor device, such as sensor 102. In other embodiments, encoder 104 may be implemented on a separate computing device that is proximate to sensor 102.

Figure 1B:
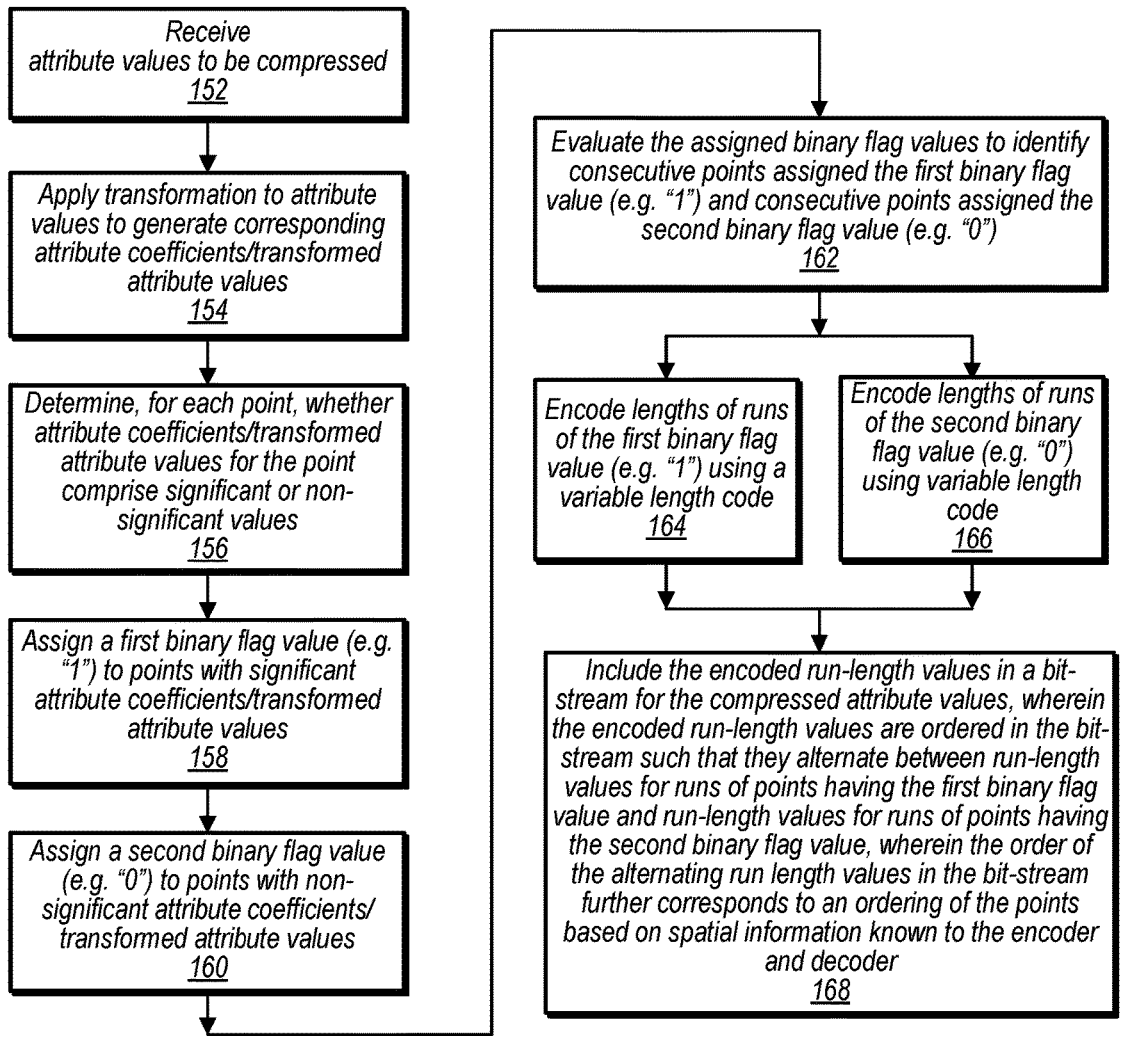
FIG. 1B illustrates a process for encoding attribute information for a set of points, such as a point cloud, according to some embodiments.

FIG. 1B illustrates a process for encoding attribute information for a set of points, such as a point cloud, according to some embodiments.

At 152, attribute values to be compressed are received. The attribute values correspond to points in 3D space. In some embodiments, spatial information (such as the coordinates of the points in 3D space) may also be received. In some embodiments, various techniques may be used by an encoder and a decoder to order the points and associated point attributes in an order such that the same ordering can be re-created at a decoder. For example, a space filing curve, K-D tree, etc. may be used to organize the points into an order than can be re-created at a decoder. In some embodiments, spatial information for the points may be separately compressed, using a sub-sampling and prediction process, for example as described in FIGS. 9A/9B or using a K-D tree as described in FIG. 10. Also in some embodiments, the spatial information and attribute information for the points may be compressed using a level of detail structure as described in FIGS. 11-14.

In some embodiments, each point may have multiple attribute values associated with the respective point. For example, in some embodiments an associated attribute may include an n-tuple of attribute values that are associated with each point, wherein the n-tuple comprises "n" different attribute values for the point. For example, an n-tuple of attribute values may include red, green, and blue color attributes for a color attribute of a point, or Y Cb Cr color attribute values for a color attribute of a point. In some embodiments, a tuple may include multiple values that represent another attribute other than color, such as a modality attribute, a point velocity attribute, a normal attribute, etc. for the point. In some embodiments, more than one tuple may be associated with a point.

At 154, a transformation (and/or quantization) is applied to the attribute values of the received attribute information to generate transformed attribute information, also referred to herein as attribute coefficient values or transformed attribute values. For example, a prediction based transformation may be applied similar to the process described in FIG. 8. Also a lifting scheme transformation may be applied similar to the process as described in FIG. 11. In some embodiments, a region adaptive hierarchical transform (RAHT) may be applied. The result of applying one or more of these transforms may be a set of attribute coefficients/transformed attribute values for each of the points. In some embodiments, the transform may be biased towards generating zero value coefficients or nearly zero value coefficients for a significant number of the points. For example, in a prediction based transform, the transformed attribute values/attribute coefficient values may be attribute correction values. For a region of a point cloud being compressed that has a solid color, the attribute correction values may be small and/or zero because the predictor may accurately predict the attribute values of the points in the solid color region based on the color values of neighboring points. Thus, the attribute correction values for such points may be small and/or zero. Thus for such a region, a prediction based transformation may generate a large number of zero or near zero value attribute coefficients/transformed attribute values.

By identifying significant and non-significant values, an encoder may improve compression efficiency. For example, instead of encoding a zero value for each component color value of each point, the encoder may instead use a flag to indicate whether a point has associated attribute coefficient values that include significant or non-significant values. For the points with non-significant values, a flag may be set indicating the non-significant attribute coefficient values for the point and further encoding resources may not be expended. For example, it may not be necessary to encode an attribute coefficient value for each component of an attribute tuple associated with such a point, for example, if it is known that none of the components of the attribute tuple comprise significant attribute coefficient values. Thus a decoder receiving the compressed attribute information that includes the flag indicating non-significance for the attribute coefficients of the attribute tuple associated with the point, may simply assign a zero value to the attribute coefficients for the components of the attribute tuple for the point without individually evaluating each tuple component separately (and without separate information being signaled for each component of the attribute tuple). In some embodiments, a point may have more than one attribute tuple associated with the point and therefore more than one attribute tuple significance flag associated with the point.

For example, at 156, an encoder determines for each point of the set of points for which attribute information is being compressed whether or not the point has attribute coefficient values that include significant or non-significant values. While, a threshold of zero or greater than zero may be used to determine significance, in some embodiments, other thresholds may be used. Also, in some embodiments, multiple significance passes may be performed by an encoder. For example, for points with significant values (e.g. values greater than zero) in a second pass it may be determined if any of the points with significant values include values of one or greater. Optionally, in a third pass it may be determined whether or not points with associated attribute coefficient values of one or greater include values of two or greater. In such embodiments, additional flags may be set, such as a one or greater flag and/or a two or greater flag. Also, as mentioned above, one or greater and two or greater are given as example additional threshold values. In some embodiments, other additional threshold values may be used.

At 158, the encoder assigns a first binary value flag to each point for which it was determined that the point had one or more associated attribute coefficient values that include a significant value. For example in some embodiments a binary flag may be implemented by assigning a value of "1" to a point if the point is associated with significant attribute coefficients and by assigning a value of "0" to the point if the point is not associated with significant attribute coefficients.

For example, at 160, the encoder assigns a second binary flag value (e.g. zero) to points for which the associated attribute coefficients do not include significant values. As mentioned above, this may be caused by points being located in a portion of a point cloud that has a consistent color, as an example. For example, because the color is consistent for a region, an encoder and decoder may accurately predict the color value such that attribute correction values (e.g. attribute coefficients) are small or negligible. Additionally, attribute coefficients may be small or negligible for other reasons, and different transforms may have different biases that bias attribute coefficient values towards zero, in some embodiments.

At 162, the encoder evaluates the assigned binary flag values (e.g. "0" or "1") to identify points in the order determined based on the spatial information for which consecutive points each have the same assigned binary flag value. In some embodiments, the points may be evaluated in the determined order, determined based on the spatial information. In some embodiments, an encoder may signal whether the first run is for a run of points having the first binary flag value (e.g. "1") or whether the first run is for a run of points having the second binary flag value (e.g. "0"). In some embodiments, an encoder and a decoder may alternate, such that the second run that follows the first run is known to have the other binary flag value, where the third run alternates back to having the first binary flag value, and so on, where each run alternates between the two binary flag values. In some embodiments, an encoder and a decoder may utilize a fixed ordering of runs that both start with the same binary flag value for the first run. In such embodiments, if the first point in the order determined based on the spatial information has a binary flag value other than the first binary flag value the encoder may encode the first run length to be a zero length run and then may proceed to encoding a run for the first point having the second binary flag value, where the first point in the order is determined based on the spatial information for the set of points.

In some embodiments, in which the encoder signals whether the first run is for a run of points having the first binary flag value (e.g. "1") or whether the first run is for a run of points having the second binary flag value (e.g. "0"), it may be impossible to have a zero length run. This is because the first run has a length of at least one and the first run and each subsequent run terminate, only after at least one point having the alternative significance flag is encountered. In some embodiments, in order to take advantage of this property, the encoder may subtract one from all the run lengths, where the decoder know to add one back to each of the run lengths. By encoding shorter run lengths (shorter by one) greater compression efficiency may be achieved.

At 164 and 166 the encoder encodes length values of runs of points assigned the first binary flag value and length values of runs of points assigned the second binary flag value. In some embodiments, the encoder may alternate between 164 and 166 for each sequential run until all the points of the set of points have been processed. In some embodiments, the encoder may encode run-length values, include the run length values in an encoded bit-stream and transmit portions of the encoded bit-stream while continuing to encode run-length values for subsequent points in the set of points being compressed. The encoder may encode the run-length values using a $K^{th}$ order exponential Golomb encoding technique as described in FIG. 4A, a Golomb-Rice encoding technique as described in FIG. 4B, a Hybrid encoding technique as described in FIG. 4C, or another suitable variable length encoding technique.

At 168, the encoder includes the encoded run-length values in a bit-stream for the compressed attribute values, wherein the encoded run-length values are ordered in the bit-stream such that they alternate between run-length values for runs of points having the first binary flag value and run-length values for runs of points having the second binary flag value, wherein the order of the alternating run length values in the bit-stream further corresponds to the ordering of the points based on spatial information known to the encoder and decoder.

In some embodiments, an encoder executing the process described in FIG. 1B, may signal the first run type (e.g. is the first run a run of points assigned the first binary flag value or a run of points assigned the second binary flag value). The encoder may then, for runs of points with significant attribute coefficients, encode the run length for the run of points with significant attribute coefficients and then jump back to the start of the run of the points with significant attribute coefficients (e.g. points assigned the first binary flag value) to then encode attribute coefficient values for the attributes/components of the attribute tuple for the points of the run of points with the significant attribute coefficients. For a run of points with non-significant attribute coefficient values, the encoder may encode a run-length value of the run, and then skip over the points with non-significant attribute coefficient values. The encoder may then repeat the process of encoding a run length for the next run of points with significant attribute coefficient values and looping back to encode the attribute coefficient values for the points with the significant attribute coefficient values. Subsequently, the encoder may encode a run length value for a run of points with non-significant attribute coefficients, and then skip over them to the next run of points with significant attribute coefficient values. The encoder may continue this process until the end of the array of points for whom attribute values are being compressed is reached.

FIG. 2A illustrates an example point cloud for which attribute information, such as color information, is to be compressed, according to some embodiments. For example, an input point cloud to be compressed may represent a person as shown in FIG. 2A.

FIG. 2B illustrates a closer view of the points for which the attribute information is to be compressed, according to some embodiments. As seen in FIG. 2B the input point cloud may include points with associated spatial information, such as coordinates in X, Y, and Z. The points of the input point cloud may also include associated attributes, such as color attributes or other attributes. FIG. 2B is showing a zoomed in portion of the point cloud of FIG. 2A showing points that fall on the person's striped shirt, where some of the points are in a white region of the striped shirt and some of the points are in a colored region of the striped shirt.

FIG. 2C illustrates points having associated attribute tuples, wherein the attribute information for the points is to be compressed, according to some embodiments. FIG. 2D illustrates points having associated attribute coefficients resulting from applying a transform operation to the attribute values associated with the points, according to some embodiments.

As can be seen in FIGS. 2C and 2D, the input attribute values in the attribute tuples for each point, such as red, blue, and green color values, may be transformed by a transformation 202 to yield attribute coefficient values. For example, transform 202 may be a prediction-based transform, as one example, or any of the other transforms described herein, such as any of the transforms described in relation to element 154 of FIG. 1B. Because in a prediction-based transform, attribute coefficient values represent corrections that need to be made at a decoder to correct a predicted value determined based on neighboring points, points within the interior of the white stripe or points within the interior or the colored stripe, such as points 2 and 3 in the interior of the first white stripe, points 6, 7, and 8 in the interior of the colored stripe, and points 11 and 12 in the interior of the second white stripe, may be accurately predicted based on the values of the neighboring points such that the attribute coefficient values (e.g. attribute correction values) are zero or nearly zero. In contrast, points on a border between the white stripe and the colored stripe, may vary in color values from a prediction determined valued, determined based on color values of neighboring points. Thus these points may have greater attribute coefficient values (e.g. attribute correction values). For example, points 4-5 and 9-10 at the boundary between the white stripe and the colored stripe may have significant coefficient values, whereas the points in the interior of the stripes had non-significant coefficient values.

Note, that points 1-12 are illustrated as being points in a vertical column for simplicity of illustration. In some embodiments, the points may be consecutive points in an ordering determined based on spatial information, which may not result in vertically arranged points being adjacent to one another in the ordering. For example, the points may be ordered based on Morton codes, K-D trees, etc. The vertical arrangement is merely used for purposes of illustrating a general point order that may be evaluated using the process as described in FIG. 1B.

As discussed at elements 156-160 of FIG. 1B, an encoder may determine whether points have associated attribute coefficients that comprise significant or non-significant values and may assign binary flags to the points based on whether or not the points include attribute coefficient values with significant or non-significant values. For example, points 1, 4, 5, 9, and 10 all include non-zero attribute coefficient values and have been assigned a first binary flag value equal to one. In contrast, points 2, 3, 6, 7, 8, 11, and 12 all include zero valued attribute coefficients and therefore have been assigned a second binary flag value equal to zero.

FIG. 2E illustrates significance flags assigned to points whose attribute value information is being compressed, according to some embodiments.

As described in element 162 of FIG. 1B, the encoder evaluates the assigned binary flag values to identify runs of points having a same assigned binary flag value. For example in FIG. 2E point 1 is assigned the first binary flag value (e.g. "1") and constitutes a run length of one (e.g. just point 1 has the binary flag value 1). Points 2 and 3 are both assigned the second binary flag value (e.g. "0") and constitute a run length of two. Next, points 4 and 5 are both assigned the first binary flag value (e.g. "1") and constitute a run length of two. Next, points 6, 7, and 8 are assigned the second binary flag value (e.g. "0") and constitute a run of three. Next, points 9 and 10 are both assigned the first binary flag value (e.g. "1") and constitute a run of two. Finally, points 11 and 12 are assigned the second binary flag value (e.g. "0") and constitute a run of two.

FIG. 2F illustrates a sequence of run-length values to be included in a bit-stream for a set of points whose attribute value information is being compressed, according to some embodiments.

Thus an encoder, such as described in FIG. 1B, may encode the values 1 . . . 2 . . . 2 . . . 3 . . . 2 . . . 2 to communicate that points 1, 4-5 and 9-10 have non-zero attribute coefficient values and points 2-3, 6-8, and 11-12 have attribute coefficient values equal to zero or that are negligible. Thus an encoder may encode 6 values to communicate the significance of the 12 points instead of encoding 12 values, e.g. one value per point.

Figure 4A:
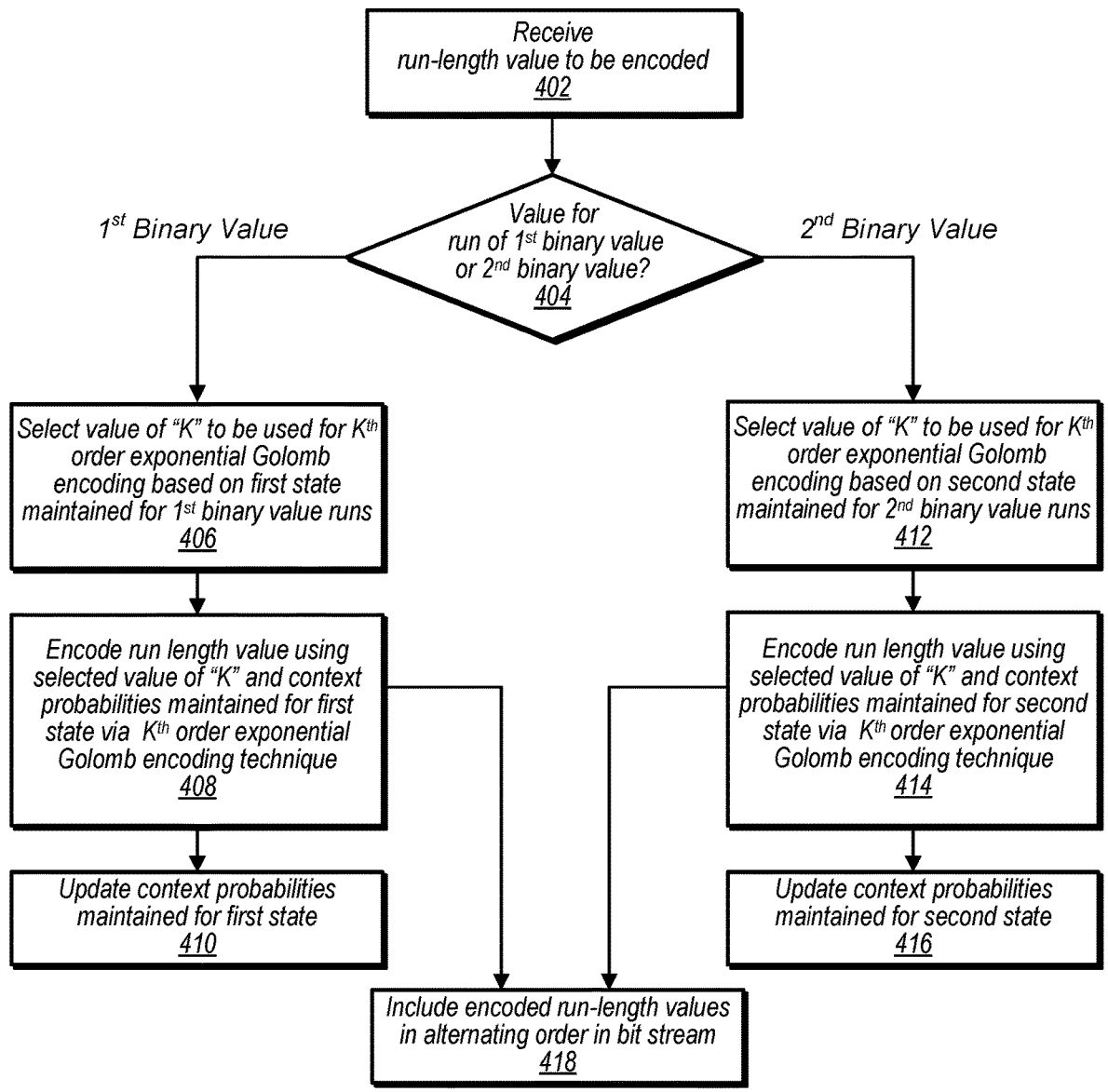
FIG. 4A illustrates a process of encoding run-length values for assigned significance flags using a $K^{th}$ order exponential Golomb encoding technique, according to some embodiments.
Figure 4B:
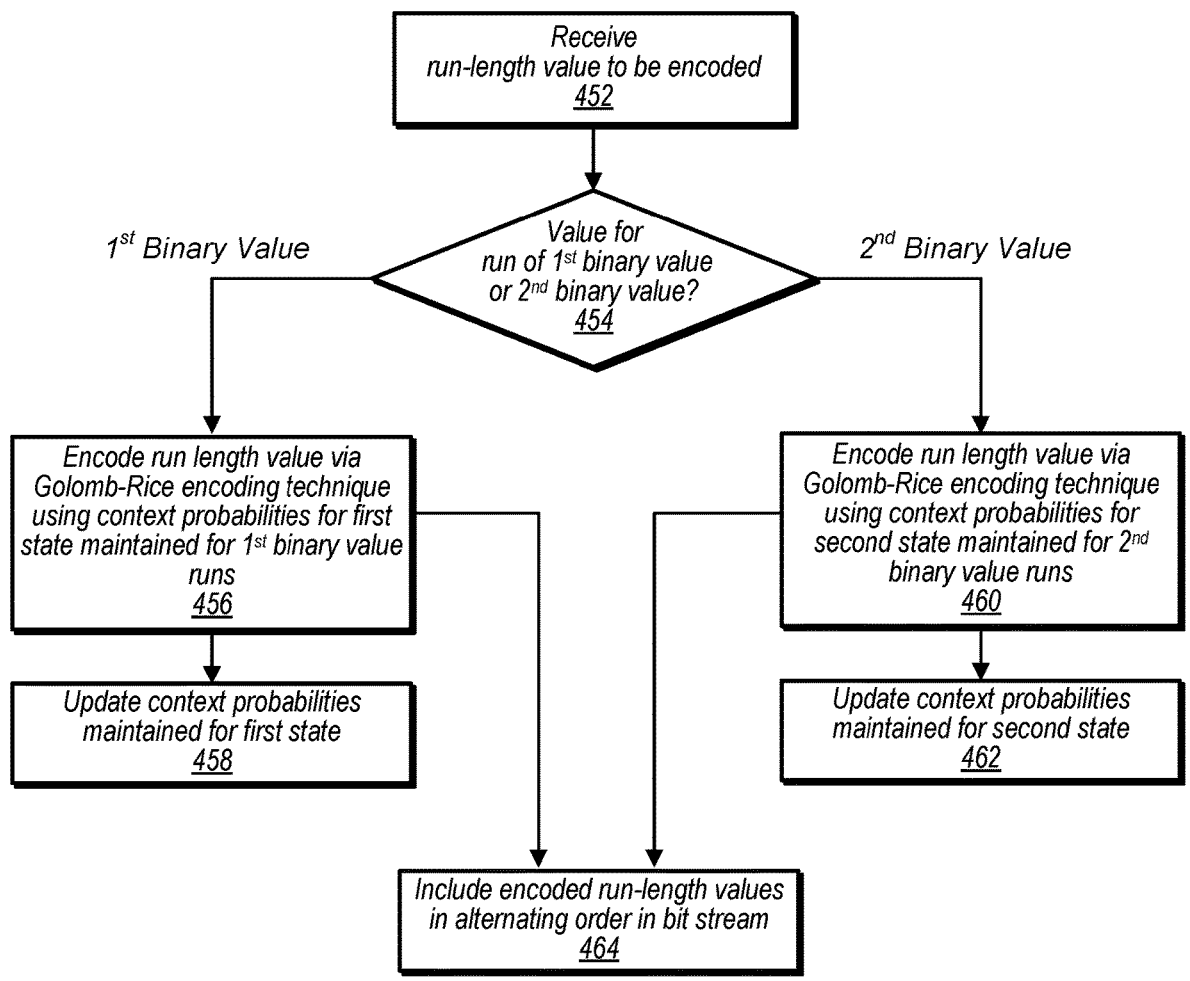
FIG. 4B illustrates a process of encoding run-length values for assigned significance flags using a Golomb-Rice encoding technique, according to some embodiments.
Figure 4C:
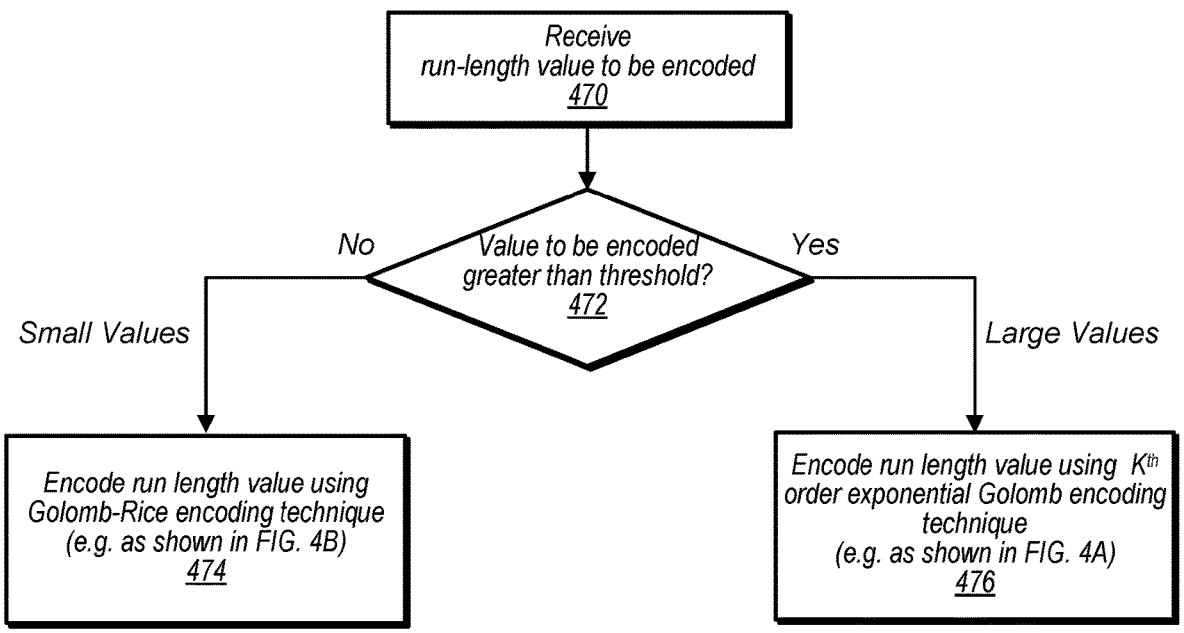
FIG. 4C illustrates a process of encoding run-length values for assigned significance flags using a hybrid $K^{th}$ order exponential Golomb and Golomb-Rice encoding technique, according to some embodiments.

Furthermore, as discussed in regard to FIGS. 4A-4C, a $K^{th}$ order exponential Golomb encoding technique and/or a Golomb-Rice encoding technique may be used to encode the values of the run-lengths to further improve compression efficiency. In some embodiments, different sets of contexts and associated probabilities may be maintained for encoding run-lengths of points assigned the first binary flag value, while separate sets of contexts and associated probabilities are maintained for encoding run-lengths of points assigned the second binary flag value.

FIG. 2G illustrates a sequence of run-length values to be included in a bit-stream for a set of points whose attribute value information is being compressed, wherein the binary flag value of the first run is signaled, according to some embodiments.

As discussed above, in some embodiments, if the binary flag value of the first run is signaled, it may be impossible to have a zero length run. Thus, in some embodiments, the encoder may subtract one from the length of each run and encode values that are decremented by one in order to improve compression efficiency. Also, a decoder that receives compressed attribute information in such a format with a signaled binary flag value for the first run may know that the run lengths have been decremented by one and add one back to the length of each of the run lengths. For example, FIG. 2G illustrates an embodiment in which the binary flag value of the first run is signaled and each of the run length values have been reduced by one.

Figure 3A:
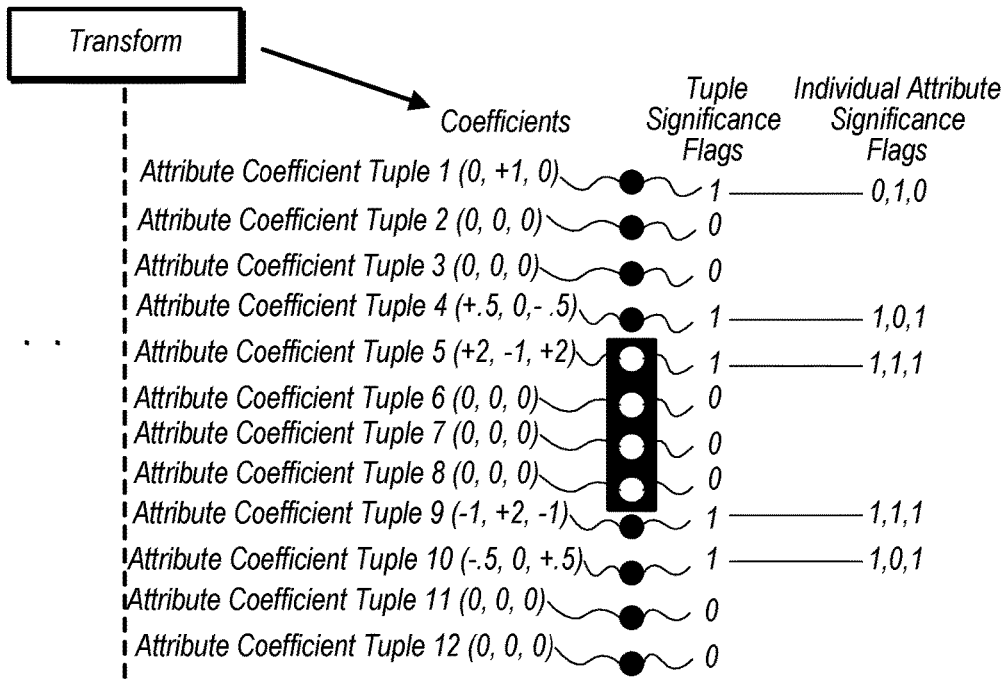
FIG. 3A illustrates additional individual attribute significance flags assigned to points with significant attribute tuples, according to some embodiments.

FIG. 3A illustrates additional individual attribute significance flags assigned to points with significant attribute tuples, according to some embodiments.

In some embodiments, additional types of significance flags may be set by an encoder. For example, for points with at least one significant valued attribute coefficient in its corresponding attribute coefficient tuple, significance flags may be set for individual components of the attribute tuple as shown in FIG. 3A. In some embodiments, an encoder may perform steps 158-166 as described in FIG. 1B for attribute tuples of points as a first pass. The encoder may then repeat steps 158-166 for individual attributes of the points assigned the first binary flag value indicating that at least one attribute of the corresponding tuple includes a significant attribute coefficient. The encoder may encode runs of individual attributes assigned the first binary flag value and runs of individual attributes assigned the second binary flag value. In some embodiments, the individual attributes may be ordered in the second pass based on their respective point order in the first pass with the points flagged as not including significant attribute coefficients excluded from the second pass. Excluding the point with non-significant attribute values from the second pass may reduce a number of attribute values being evaluated and encoded and therefore improve compression efficiency of the second pass.

Figure 3B:
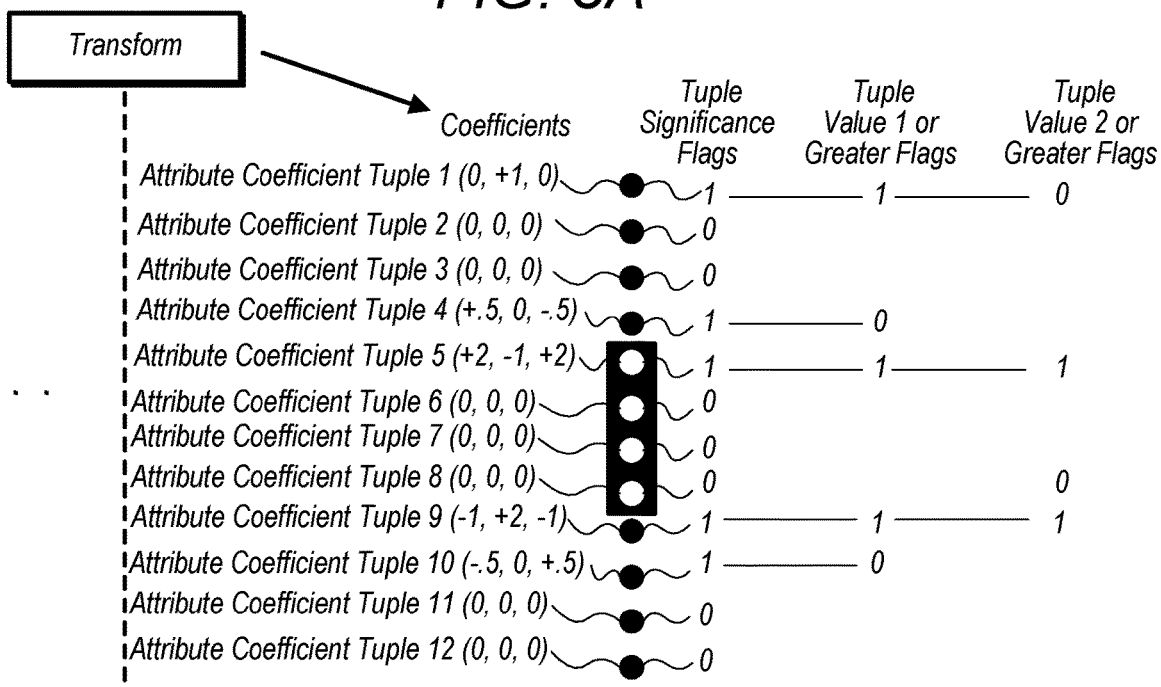
FIG. 3B illustrates additional attribute significance flags, with other significance thresholds, assigned to points whose attribute information is being compressed, according to some embodiments.

FIG. 3B illustrates additional attribute significance flags, with other significance thresholds, assigned to points whose attribute information is being compressed, according to some embodiments.

In a similar manner as described for FIG. 3A, an encoder may make a second or third pass applying different significance thresholds. For example, a first pass may determine whether any attribute coefficients in a tuple has a non-zero value, as described above. In a second pass, as shown in FIG. 3B, an encoder may assign a first binary flag value to points with at least one attribute coefficient value greater than one and a second binary flag value to points with attribute coefficient values greater than zero but less than one. Likewise, in a third pass, an encoder may assign a first binary flag value to points with at least one attribute coefficient greater than two and a second binary flag value to points with attribute coefficient values greater than one but less than two. Note than in some embodiments, other significance threshold may be used for a first pass, second pass, or third pass. Also, in some embodiments, only points assigned the first binary flag value in a current pass (e.g. "1") may be evaluated in the subsequent pass. Thus, points with all zero values may be excluded from being considered in the second pass, and points with values less than one may be excluded from being considered in the third pass, as an example.

FIG. 4A illustrates a process of encoding run-length values for assigned significance flags using a $K^{th}$ order exponential Golomb encoding technique, according to some embodiments.

At 402, a run-length value, such as one of the run length values illustrated in FIG. 2E is received by a $K^{th}$ order exponential Golomb encoding module. At 404, it is determined whether or not the run-length value to be encoded is for a run corresponding to the first binary flag value or a run corresponding to the second binary flag value. For example, whether the run is for a run of points with significant attribute coefficients or is for a run of points with non-significant attribute coefficients.

If determined at 404 that the run is for points assigned the first binary flag value (e.g. indicating significant attribute coefficient values), at 406 the $K^{th}$ order exponential Golomb encoding module selects a value of K based on a first state maintained for runs of points assigned the first binary flag value. Also, at 408, the $K^{th}$ order exponential Golomb encoding module uses the selected value of K and one or more contexts and associated probabilities maintained for the first state to encode the run length value, wherein separate contexts and probabilities are maintained for the first state that are separate from contexts and probabilities maintained for a second state corresponding to runs of points assigned the second binary flag value At 410, the $K^{th}$ order exponential Golomb encoding module updates the probabilities maintained for the first state based on the run-length value encoded at 408.

If determined at 404 that the run is for points assigned the second binary flag value (e.g. indicating non-significant attribute coefficient values), at 412 the $K^{th}$ order exponential Golomb encoding module selects a value of K based on the second state maintained for runs of points assigned the second binary flag value. Also, at 414, the $K^{th}$ order exponential Golomb encoding module uses the selected value of K and one or more contexts and associated probabilities maintained for the second state to encode the run-length value.

At 416, the $K^{th}$ order exponential Golomb encoding module updates the probabilities maintained for the second state based on the run-length value encoded at 414.

At 418, the $K^{th}$ order exponential Golomb encoding module includes the encoded run-length values in the bitstream in an alternating order.

In some embodiments, to select K, an encoder may, after each (de)coded run-length, compare the (de)coded run-length to the parameter k. If the run-length is greater than a first threshold $4^{(k+1)}$ the corresponding parameter may be incremented by 1 to a maximum of 3. Otherwise, if the run-length is less than a second threshold $2^{(k-1)}$, the corresponding parameter k may be decremented by 1 to a minimum of 0.

In other examples, the parameter k may be updated after (de)coding a number of run-length values.

In some embodiments the dynamic update process is applied to both the zero-run and non-zero-run k parameters. In other embodiments, the dynamic update process may be applied only to one of the parameters.

FIG. 4B illustrates a process of encoding run-length values for assigned significance flags using a Golomb-Rice encoding technique, according to some embodiments.

At 452, a run-length value, such as one of the run length values illustrated in FIG. 2E is received by a Golomb-Rice encoding module. At 454, it is determined whether or not the run-length value to be encoded is for a run corresponding to a run of points assigned the first binary flag value or a run of points assigned the second binary flag value.

If determined at 454 that the run is for points assigned the first binary flag value (e.g. indicating significant attribute coefficient values), the Golomb-Rice encoding module, at 456, uses one or more contexts and associated probabilities maintained for a first state to encode the run length value wherein separate context and probabilities are maintained for the first state and a second state corresponding to runs of points assigned the second binary flag value At 458, the Golomb-Rice encoding module updates the probabilities maintained for the first state based on the run-length value encoded at 456.

If determined at 454 that the run is for points assigned the second binary flag value (e.g. indicating non-significant attribute coefficient values), at 460, the Golomb-Rice encoding module uses one or more contexts and associated probabilities maintained for the second state to encode the run-length value.

At 462, the Golomb-Rice encoding module updates the probabilities maintained for the second state based on the run-length value encoded at 460.

At 464, the Golomb-Rice encoding module includes the encoded run-length values in the bit-stream in an alternating order.

In some embodiments, the parameters of the variable length encoding binarisation may be fixed. For example using a 0-th order exponential Golomb code.

The parameter chosen for runs of insignificant coefficients (e.g. runs with points assigned the second binary flag value (e.g. "0") may be different to that chosen for runs of significant coefficients (e.g. runs with points assigned the first binary flag value (e.g. "1"). For example, a 0-th order exponential Golomb code may be used for zero coefficient runs, while a higher order (e.g. 2nd order exponential Golomb code) is used for significant coefficients runs. Such a choice may provide a balance of the likelihood of different run lengths at different codec operating points.

In some embodiments, a different binarisation may be used for zero and non-zero runs. For example, an $N^{th}$ order Golomb-Rice code may be used for zero-runs (e.g. runs with points assigned the second binary flag value (e.g. "0"), and an $M^{th}$ order Golomb-Rice code may be used for non-zero runs (e.g. runs with points assigned the first binary flag value (e.g. "1").

FIG. 4C illustrates a process of encoding run-length values for assigned significance flags using a hybrid $K^{th}$ order exponential Golomb and Golomb-Rice encoding technique, according to some embodiments.

In some embodiments, a hybrid encoding technique may be used by an encoder, wherein a run-length value encoding module receives, at 470, a run-length value to be encoded. At 472, the run-length value encoding module determines whether or not the run-length value is a large valued run-length or a small-valued run-length. For example, a threshold run-length value may be used to determine whether the run-length value to be encoded is small or large.

If the value is small, at 474, a Golomb-Rice encoding technique as described in FIG. 4B may be used to encode the run-length value.

If the value is large, at 476, a $K^{th}$ order exponential Golomb encoding technique as described in FIG. 4A may be used to encode the run-length value.

Figure 5:
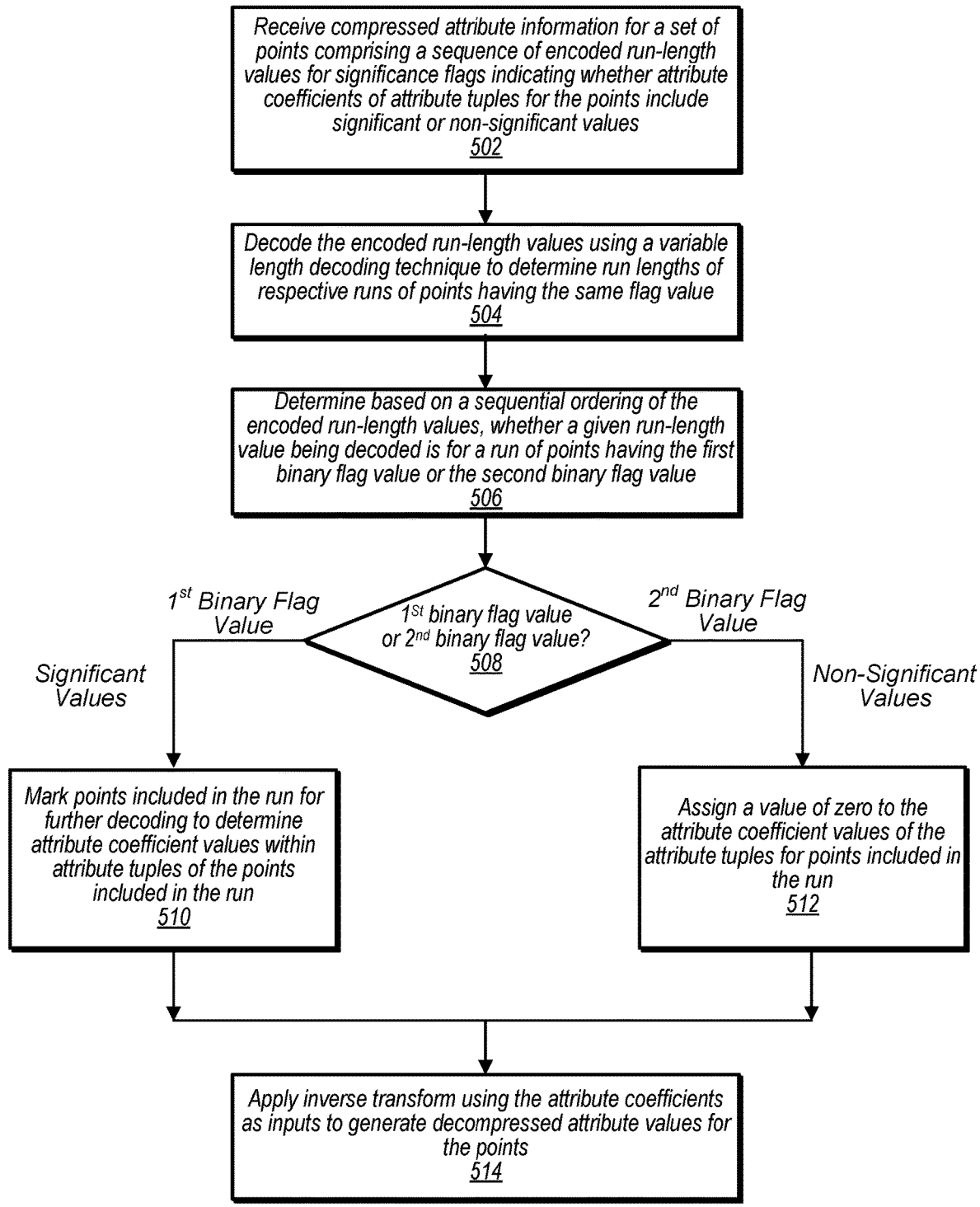
FIG. 5 illustrates a process of determining attribute coefficient values/transformed attribute values based on a received set of compressed attribute information that includes encoded run-length values for significance flags assigned to points, according to some embodiments.

FIG. 5 illustrates a process of determining attribute coefficient values/transformed attribute values based on a received set of compressed attribute information that includes encoded run-length values for significance flags assigned to points, according to some embodiments.

At 502, a decoder receives compressed attribute information for a set of points comprising a sequence of encoded run-length values for significance flags indicating whether attribute coefficients of attribute tuples for the points include significant or non-significant values. For example, the decoder may receive a compressed attribute file generated by an encoder implementing the processes described in FIGS. 1B-4C.

At 504, the decoder decodes the encoded run-length values, using a $K^{th}$ order exponential Golomb coding technique, a Golomb-Rice coding technique, or a hybrid coding technique similar to that described in FIG. 4A, 4B, or 4C. The decoded values indicate run-lengths for alternating runs of points assigned the first binary flag value and runs of points assigned the second binary flag value. As discussed above, in some embodiments whether the first run is for a run of points assigned the first or second binary flag value may be signaled in the bit-stream. Also, in some embodiments, the encoder and decoder may begin with a same binary flag value (e.g. the first or second binary flag value) and if the first run is for the other one of the binary flag values, the first run may be signaled to have a length of zero. For example, if the first point in the order based on the spatial information is assigned the second binary flag value and both the encoder and decoder are configured to start with runs for the first binary flag value, the first run may be signaled to have a zero length so that the first point according to the spatial information order is the first point of the second run (which has a length greater than zero). For example, at 506 the decoder determines whether a run-length value being decoded is for a run of points assigned the first binary flag value or the second binary flag value.

At 510, if it is determined at 506/508 that the run is for a run of points assigned the first binary flag value, the decoder marks the points included in the run for further decoding to determine the attribute coefficient values for the attributes of the attribute tuples associated with the points of the run. In some embodiments, a decoder may further perform a second pass or third pass similar to a decoder version of what is described in FIGS. 3A/3B. Though for simplicity, FIG. 5 illustrates a single pass.

At 512, if it is determined at 506/508, that the run is for a run of points assigned the second binary flag value, the decoder assigns a value of zero to the attribute coefficients for the points included in the run and avoids further processing of the individual attribute coefficients of the tuples for the points because they are known to have zero or negligible values.

At 514, the decoder uses the attribute coefficient values determined at 510 (and as part of further decoding) and marked at 512 as inputs to an inverse transform function to reconstruct the attribute values of the points. For example, if the transform function applied is a prediction-based transform function, the attribute coefficient values correspond to attribute correction values. In such embodiments, the decoder predicts attributes for the points and applies the attribute coefficient values (e.g. attribute correction values) to correct the predicted attribute values to reconstruct the attribute values for the points.

In some embodiments, a decoder may determine a run type of an initial run (e.g. is the initial run for a run of points assigned the first binary flag value or a run of points assigned the second binary flag value). The run-type of the first run may be signaled in the bit-stream. If the first run is a run with the binary flag value corresponding to significant values, the decoder may initialize an index for the attribute coefficient values for the points of the first run with corresponding slots in the index to be further filled in with further decoded attribute coefficient values for the points of the first run. Because the run-types alternate, the decoder knows that the next run will be for points with non-significant coefficient values. Thus, the decoder, may simply assign zero values to all points in the index for a the next run with non-significant coefficient values, then pick back up with creating index slots for the subsequent run of points with significant coefficient values. Also, as discussed above, in some embodiments in which the binary flag value of the first run is signaled, the run-lengths may be reduced by a value of one at the encoder to improve compression efficiency. Thus, the decoder may increment the run lengths by one.

Figure 6A:
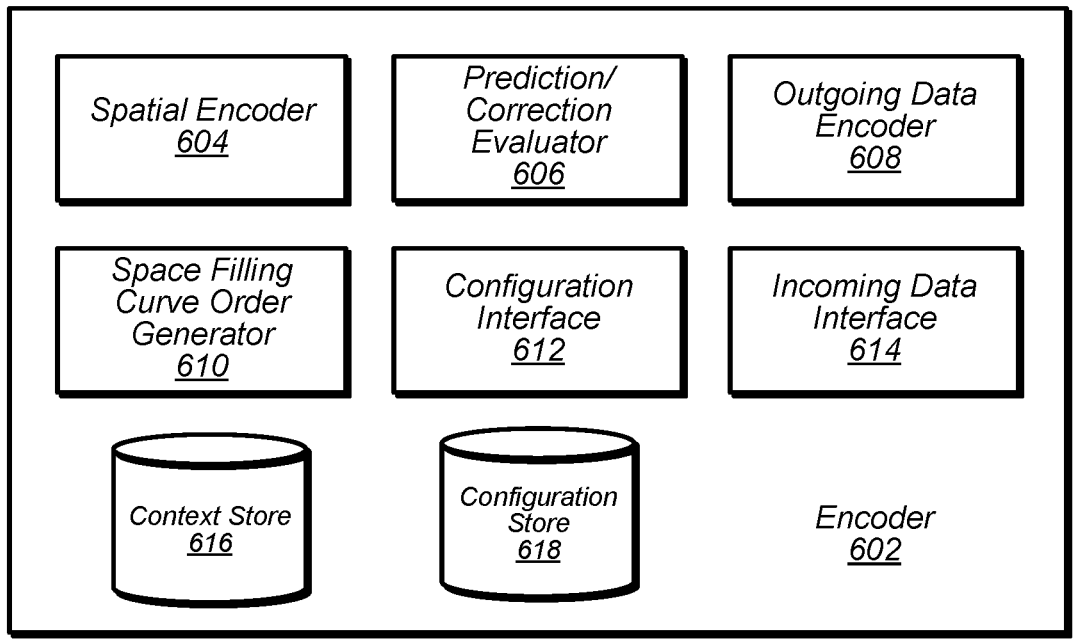
FIG. 6A illustrates components of an encoder, according to some embodiments.

FIG. 6A illustrates components of an encoder, according to some embodiments.

Encoder 602 may be a similar encoder as encoder 104 illustrated in FIG. 1A and may perform similar steps as described in FIGS. 1B thru 4C to encode attribute values for a set of points. Encoder 602 includes spatial encoder 604, space filling curve order generator 610, prediction/correction evaluator 606, incoming data interface 614, and outgoing data interface 608. Encoder 602 also includes context store 616 and configuration store 618.

In some embodiments, a spatial encoder, such as spatial encoder 604, may compress spatial information associated with points of a point cloud, such that the spatial information can be stored or transmitted in a compressed format. In some embodiments, a spatial encoder, may utilize K-D trees to compress spatial information for points of a point cloud as discussed in more detail in regard to FIG. 10. Also, in some embodiments, a spatial encoder, such as spatial encoder 604, may utilize a sub-sampling and prediction technique as discussed in more detail in regard to FIGS. 9A-B. In some embodiments, a spatial encoder, such as spatial encoder 604, may utilize Octrees to compress spatial information for points of a point cloud or various other techniques to compression spatial information for points of a point cloud.

In some embodiments, compressed spatial information may be stored or transmitted with compressed attribute information or may be stored or transmitted separately. In either case, a decoder receiving compressed attribute information for points of a point cloud may also receive compressed spatial information for the points of the point cloud, or may otherwise obtain the spatial information for the points of the point cloud.

A space filling curve order generator, such as space filling curve order generator 610, may utilize spatial information for points of a point cloud to generate an indexed order of the points based on where the points fall along a space filling curve. For example Morton codes may be generated for the points of the point cloud. Because a decoder is provided or otherwise obtains the same spatial information for points of a point cloud as are available at the encoder, a space filling curve order determined by a space filling curve order generator of an encoder, such as space filling curve order generator 610 of encoder 602, may be the same or similar as a space filling curve order generated by a space filling curve order generator of a decoder, such as space filling curve order generator 628 of decoder 620.

A prediction/correction evaluator, such as prediction/correction evaluator 606 of encoder 602, may determine predicted attribute values for points of a point cloud based on an inverse distance interpolation method using attribute values of the K-nearest neighboring points of a point for whom an attribute value is being predicted. The prediction/correction evaluator may also compare a predicted attribute value of a point being evaluated to an original attribute value of the point in a non-compressed point cloud to determine an attribute correction value. In some embodiments, a prediction/correction evaluator, such as prediction/correction evaluator 606 of encoder 602, may adaptively adjust a prediction strategy used to predict attribute values of points in a given neighborhood of points based on a measurement of the variability of the attribute values of the points in the neighborhood. In some embodiments, other transforms, such as a lifting scheme or a region-adaptive hierarchical transform (RAHT), or other suitable transform may be used in addition to, or instead of a prediction and prediction correction transform.

An outgoing data encoder, such as outgoing data encoder 608 of encoder 602, may encode attribute correction values and assigned attribute values included in a compressed attribute information file for a point cloud. For example, outgoing data encoder 608 may assign significance flags to points, determine run lengths of points assigned a same binary attribute flag value, and may utilize a $K^{th}$ order exponential Golomb encoding technique, a Golomb-Rice encoding technique, and/or a hybrid encoding technique to encode the value of the run-length. For example, outgoing data encoder 602, may perform the steps of the process illustrated in FIG. 1B and may use one or more of the encoding techniques illustrated in FIGS. 4A, 4B, and 4C to encode the outgoing compressed attribute information. In some embodiments, an outgoing data encoder, such as outgoing data encoder 608, may select an encoding context for encoding a value, such as a run-length value, based on a state associated with the run-length value, such as whether the run-length value is for a run of points with the first binary flag value or the second binary flag value. In some embodiments, multiple contexts and associated probabilities may be maintained for each state, for example in context store 616. In some embodiments, a portion of a value may be encoded using Golomb-Rice encoding while another portion of the value may be encoded using Golomb exponential encoding. In some embodiments, an encoder, such as encoder 602, may include a context store, such as context store 616, that stores encoding contexts used by an outgoing data encoder, such as outgoing data encoder 608, to encode run-lengths, attribute correction values, and assigned attribute values.

In some embodiments, an encoder, such as encoder 602, may also include an incoming data interface, such as incoming data interface 614. In some embodiments, an encoder may receive incoming data from one or more sensors that capture points of a point cloud or that capture attribute information to be associated with points of a point cloud. For example, in some embodiments, an encoder may receive data from an LIDAR system, 3-D-camera, 3-D scanner, etc. and may also receive data from other sensors, such as a gyroscope, accelerometer, etc. Additionally, an encoder may receive other data such as a current time from a system clock, etc. In some embodiments, such different types of data may be received by an encoder via an incoming data interface, such as incoming data interface 614 of encoder 602.

In some embodiments, an encoder, such as encoder 602, may further include a configuration interface, such as configuration interface 612, wherein one or more parameters used by the encoder to compress a point cloud may be adjusted via the configuration interface. In some embodiments, a configuration interface, such as configuration interface 612, may be a programmatic interface, such as an API. Configurations used by an encoder, such as encoder 602, may be stored in a configuration store, such as configuration store 618.

In some embodiments, an encoder, such as encoder 602, may include more or fewer components than shown in FIG. 6A.

Figure 6B:
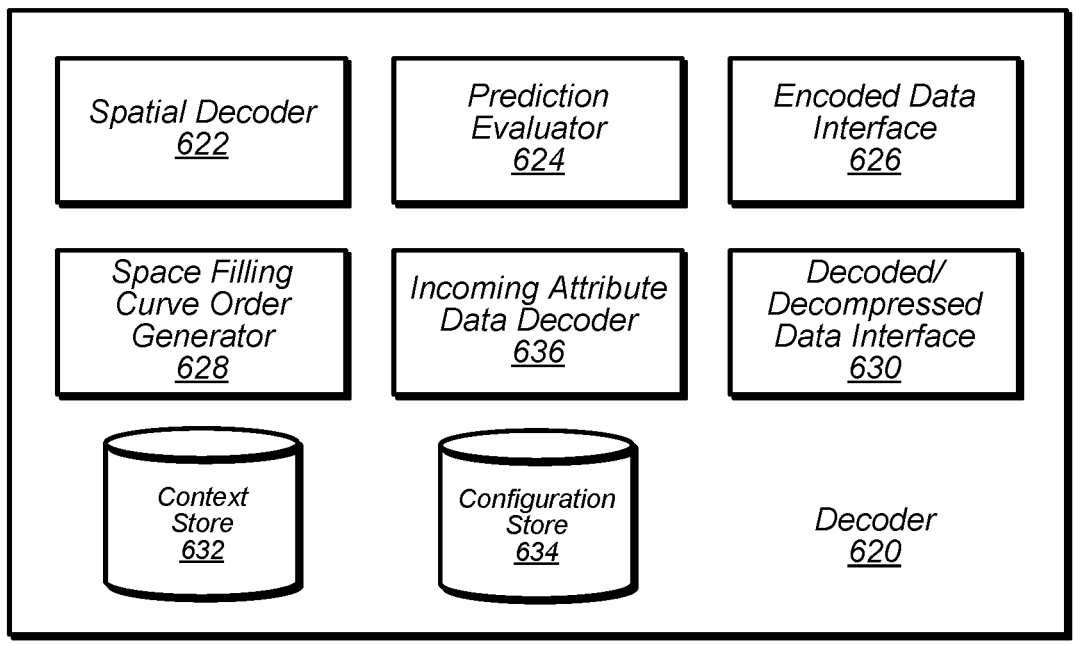
FIG. 6B illustrates components of a decoder, according to some embodiments.

FIG. 6B illustrates components of a decoder, according to some embodiments.

Decoder 620 may be a similar decoder as decoder 116 illustrated in FIG. 1A. Also, decoder 620 may perform a similar process as described in FIG. 5 to decode compressed attribute information that includes encoded values for run-lengths of points assigned a same binary attribute significance flag. Decoder 620 includes encoded data interface 626, spatial decoder 622, space filling curve order generator 628, incoming attribute data decoder 636, prediction evaluator 624, context store 632, configuration store 634, and decoded/decompressed data interface 620.

A decoder, such as decoder 620, may receive an encoded compressed point cloud and/or an encoded compressed attribute information file for points of a point cloud. For example, a decoder, such as decoder 620, may receive a compressed attribute information file, such a compressed attribute information 112 illustrated in FIG. 1A or compressed attribute information file 700 illustrated in FIG. 7 or compressed attribute information file 1250 illustrated in FIG. 12B. The compressed attribute information file may be received by a decoder via an encoded data interface, such as encoded data interface 626. The encoded compressed point cloud may be used by the decoder to determine spatial information for points of the point cloud. For example, spatial information of points of a point cloud included in a compressed point cloud may be generated by a spatial information generator, such as spatial information generator 622. In some embodiments, a compressed point cloud may be received via an encoded data interface, such as encoded data interface 626, from a storage device or other intermediary source, wherein the compressed point cloud was previously encoded by an encoder, such as encoder 104.

In some embodiments, an encoded data interface, such as encoded data interface 626, may decode spatial information. For example the spatial information may have been encoded using various encoding techniques such as arithmetic encoding, Golomb encoding, etc. A spatial information generator, such as spatial information generator 622, may receive decoded spatial information from an encoded data interface, such as encoded data interface 626, and may use the decoded spatial information to generate a representation of the geometry of the point cloud being de-compressed. For example, decoded spatial information may be formatted as residual values to be used in a sub-sampled prediction method to recreate a geometry of a point cloud to be decompressed. In such situations, the spatial information generator 622, may recreate the geometry of the point cloud being decompressed using decoded spatial information from encoded data interface 626, and space filling curve order generator 628 may determine a space filling curve order for the point cloud being decompressed based on the recreated geometry for the point cloud being decompressed generated by spatial information generator 622.

Once spatial information for a point cloud is determined and a space-filling curve order has been determined, the space-filling curve order may be used by a prediction evaluator of a decoder, such as prediction evaluator 624 of decoder 620, to determine an evaluation order for determining attribute values of points of the point cloud. Additionally, the space-filling curve order may be used by a prediction evaluator, such as prediction evaluator 624, to identify nearest neighboring points to a point being evaluated. Likewise, the space-filling curve order may be used by incoming attribute data decoder 636 to assign significance flags to points based on encoded run-length values, wherein the run-length values corresponds to runs of points according to the space-filling curve order. As discussed above, in some embodiments, other spatial ordering techniques, other than a space filling curve may be used.

A prediction evaluator of a decoder, such as prediction evaluator 624, may select a starting point of a space filling curve or other evaluation order based on an assigned starting point included in a compressed attribute information file. In some embodiments, the compressed attribute information file may include one or more assigned values for one or more corresponding attributes of the starting point. In some embodiments, a prediction evaluator, such as prediction evaluator 624, may assign values to one or more attributes of a starting point in a decompressed model of a point cloud being decompressed based on assigned values for the starting point included in a compressed attribute information file. A prediction evaluator, such as prediction evaluator 624, may further utilize the assigned values of the attributes of the starting point to determine attribute values of neighboring points. For example, a prediction evaluator may select a neighboring point to the starting point as a next point to evaluate, wherein the neighboring point is selected based on an index order of the points according to the space-filling curve order. Note that because the space-filling curve order is generated based on the same or similar spatial information at the decoder as was used to generate a space-filling curve order at an encoder, the decoder may determine the same evaluation order for evaluating the points of the point cloud being decompressed as was determined at the encoder by identifying next nearest neighbors in an index according to the space-filling curve order.

Once the prediction evaluator has identified the "K" nearest neighboring points to a point being evaluated, the prediction evaluator may predict one or more attribute values for one or more attributes of the point being evaluated based on attribute values of corresponding attributes of the "K" nearest neighboring points. In some embodiments, an inverse distance interpolation technique may be used to predict an attribute value of a point being evaluated based on attribute values of neighboring points, wherein attribute values of neighboring points that are at a closer distance to the point being evaluated are weighted more heavily than attribute values of neighboring points that are at further distances from the point being evaluated. In some embodiments, a prediction evaluator of a decoder, such as prediction evaluator 624 of decoder 620, may adaptively adjust a prediction strategy used to predict attribute values of points in a given neighborhood of points based on a measurement of the variability of the attribute values of the points in the neighborhood. For example, in embodiments wherein adaptive prediction is used, the decoder may mirror prediction adaptation decisions that were made at an encoder. In some embodiments, adaptive prediction parameters may be included in compressed attribute information received by the decoder, wherein the parameters were signaled by an encoder that generated the compressed attribute information. In some embodiments, a decoder may utilize one or more default parameters in the absence of a signaled parameter, or may infer parameters based on the received compressed attribute information.

A prediction evaluator, such as prediction evaluator 624, may apply an attribute correction value to a predicted attribute value to determine an attribute value to include for the point in a decompressed point cloud. In some embodiments, an attribute correction value for an attribute of a point may be generated by incoming data decoder 636 based on attribute significance run-lengths included in a compressed attribute information file, along with more detailed attribute information included in the compressed attribute information file for points assigned a binary value indicating that attribute coefficients for the points are significant. In some embodiments, attribute correction values may be encoded using one of a plurality of supported coding contexts, wherein different coding contexts are selected to encode different attribute correction values. In some embodiments, a decoder, such as decoder 620, may include a context store, such as context store 632, wherein the context store stores a plurality of encoding context that may be used to decode assigned attribute values, run-length values, and/or attribute correction values that have been encoded using corresponding encoding contexts at an encoder.

A decoder, such as decoder 620, may provide a decompressed point cloud generated based on a received compressed point cloud and/or a received compressed attribute information file to a receiving device or application via a decoded data interface, such as decoded data interface 630. The decompressed point cloud may include the points of the point cloud and attribute values for attributes of the points of the point cloud. In some embodiments, a decoder may decode some attribute values for attributes of a point cloud without decoding other attribute values for other attributes of a point cloud. For example, a point cloud may include color attributes for points of the point cloud and may also include other attributes for the points of the point cloud, such as velocity, for example. In such a situation, a decoder may decode one or more attributes of the points of the point cloud, such as the velocity attribute, without decoding other attributes of the points of the point cloud, such as the color attributes.

In some embodiments, the decompressed point cloud and/or decompressed attribute information file may be used to generate a visual display, such as for a head mounted display. Also, in some embodiments, the decompressed point cloud and/or decompressed attribute information file may be provided to a decision making engine that uses the decompressed point cloud and/or decompressed attribute information file to make one or more control decisions. In some embodiments, the decompressed point cloud and/or decompressed attribute information file may be used in various other applications or for various other purposes.

FIG. 7 illustrates an example compressed attribute information file, according to some embodiments. Attribute information file 700 includes configuration information 702, point cloud data 704, and point attribute correction values 706. In some embodiments, point cloud file 700 may be communicated in parts via multiple packets. In some embodiments, not all of the sections shown in attribute information file 700 may be included in each packet transmitting compressed attribute information. In some embodiments, an attribute information file, such as attribute information file 700, may be stored in a storage device, such as a server that implements an encoder or decoder, or other computing device. In some embodiments, additional configuration information may include adaptive prediction parameters, such as a variability measurement technique to use to determine a variability measurement for a neighborhood of points, a threshold variability value to trigger use of a particular prediction procedure, one or more parameters for determining a size of a neighborhood of points for which variability is to be determined, etc.

Figure 8:
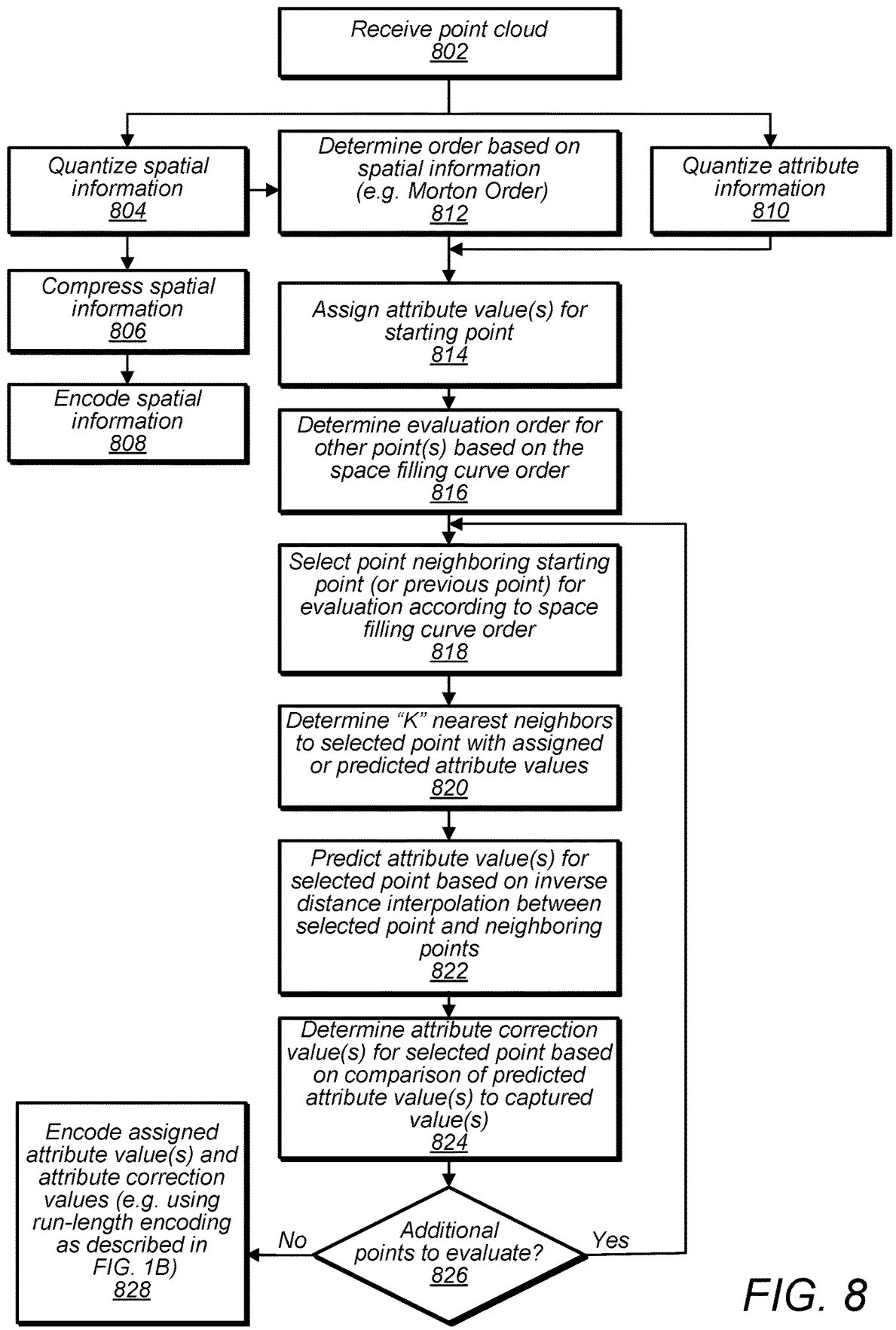
FIG. 8 illustrates an example prediction based transform process for compressing attribute information for a set of points, such as a point cloud, according to some embodiments.

FIG. 8 illustrates a process for compressing attribute information of a point cloud, according to some embodiments.

At 802, an encoder receives a point cloud that includes attribute information for at least some of the points of the point cloud. The point cloud may be received from one or more sensors that capture the point cloud, or the point cloud may be generated in software. For example, a virtual reality or augmented reality system may have generated the point cloud.

At 804, the spatial information of the point cloud, for example X, Y, and Z coordinates for the points of the point cloud may be quantized. In some embodiments, coordinates may be rounded off to the nearest measurement unit, such as a meter, centimeter, millimeter, etc.

At 806, the quantized spatial information is compressed. In some embodiments, spatial information may be compressed using a sub-sampling and subdivision prediction technique as discussed in more detail in regard to FIGS. 9A-B. Also, in some embodiments, spatial information may be compressed using a K-D tree compression technique as discussed in more detail in regard to FIG. 10, or may be compressed using an Octree compression technique. In some embodiments, other suitable compression techniques may be used to compress spatial information of a point cloud.

At 808, the compressed spatial information for the point cloud is encoded as a compressed point cloud file or a portion of a compressed point cloud file. In some embodiments, compressed spatial information and compressed attribute information may be included in a common compressed point cloud file, or may be communicated or stored as separate files.

At 812, the received spatial information of the point cloud is used to generate an indexed point order according to a space-filling curve or other suitable spatial ordering technique. In some embodiments, the spatial information of the point cloud may be quantized before generating the order according to the space-filling curve. Additionally, in some embodiments wherein a lossy compression technique is used to compress the spatial information of the point cloud, the spatial information may be lossy encoded and lossy decoded prior to generating the order according to the space filling curve. In embodiments that utilize lossy compression for spatial information, encoding and decoding the spatial information at the encoder may ensure that an order according to a space filling curve generated at the encoder will match an order according to the space filling curve that will be generated at a decoder using decoded spatial information that was previously lossy encoded.

Additionally, in some embodiments, at 810, attribute information for points of the point cloud may be quantized. For example attribute values may be rounded to whole numbers or to particular measurement increments. In some embodiments wherein attribute values are integers, such as when integers are used to communicate string values, such as "walking", "running", "driving", etc., quantization at 810 may be omitted.

At 814, attribute values for a starting point are assigned. The assigned attribute values for the starting point are encoded in a compressed attribute information file along with attribute correction values. Because, in prediction-transform embodiments, a decoder predicts attribute values based on distances to neighboring points and attribute values of neighboring points, at least one attribute value for at least one point is explicitly encoded in a compressed attribute file. In some embodiments, points of a point cloud may comprise multiple attributes and at least one attribute value for each type of attribute may be encoded for at least one point of the point cloud, in such embodiments. In some embodiments, a starting point may be a first point evaluated when determining the order according to the space filling curve at 812. In some embodiments, an encoder may encode data indicating spatial information for a starting point and/or other indicia of which point of the point cloud is the starting point or starting points. Additionally, the encoder may encode attribute values for one or more attributes of the starting point.

At 816, the encoder determines an evaluation order for predicting attribute values for other points of the point cloud, other than the starting point, said predicting and determining attribute correction values, may be referred to herein as "evaluating" attributes of a point. The evaluation order may be determined based on the order according to the space filling curve.

At 818, a neighboring point of the starting point or of a subsequent point being evaluated is selected. In some embodiments, a neighboring point to be next evaluated may be selected based on the neighboring point being a next point in an indexed order of points according to a space filling curve.

At 820, the "K" nearest neighboring points to the point currently being evaluated are determined. The parameter "K" may be a configurable parameter selected by an encoder or provided to an encoder as a user configurable parameter. In order to select the "K" nearest neighboring points, an encoder may identify the first "K" nearest points to a point being evaluated according to the indexed order of points determined at 812 and respective distances between the points. For example, instead of determining the absolute nearest neighboring points to a point being evaluated, an encoder may select a sub-group of points of the point cloud having index values in the index according to the space-filling curve that are within a user defined search range, e.g. 8, 16, 32, 64, etc. of an index value of a particular point being evaluated. The encoder may then utilize distances within the sub-group of points to select the "K" nearest neighboring points to use for prediction. In some embodiments, only points having assigned attribute values or for which predicted attribute values have already been determined may be included in the "K" nearest neighboring points. In some embodiments various numbers of points may be identified. For example, in some embodiments, "K" may be 5 points, 10 points, 16 points, etc. Because a point cloud comprises points in 3-D space a particular point may have multiple neighboring points in multiple planes. In some embodiments, an encoder and a decoder may be configured to identify points as the "K" nearest neighboring points regardless of whether or not a value has already been predicted for the point. Also, in some embodiments, attribute values for points used in predication may be previously predicted attribute values or corrected predicted attribute values that have been corrected based on applying an attribute correction value. In either case, an encoder and a decoder may be configured to apply the same rules when identifying the "K" nearest neighboring points and when predicting an attribute value of a point based on attribute values of the "K" nearest neighboring points.

At 822, one or more attribute values are determined for each attribute of the point currently being evaluated. The attribute values may be determined based on an inverse distance interpolation. The inverse distance interpolation may interpolate the predicted attribute value based on the attribute values of the "K" nearest neighboring points. The attribute values of the "K" nearest neighboring points may be weighted based on respective distances between respective ones of the "K" nearest neighboring points and the point being evaluated. Attribute values of neighboring points that are at shorter distances from the point currently being evaluated may be weighted more heavily than attribute values of neighboring points that are at greater distances from the point currently being evaluated.

At 824, attribute correction values are determined for the one or more predicted attribute values for the point currently being evaluated. The attribute correction values may be determined based on comparing the predicted attribute values to corresponding attribute values for the same point (or a similar point) in the point cloud prior to attribute information compression. In some embodiments, quantized attribute information, such as the quantized attribute information generated at 810, may be used to determine attribute correction values. In some embodiments, an attribute correction value may also be referred to as a "residual error" wherein the residual error indicates a difference between a predicted attribute value and an actual attribute value.

At 826, it is determined if there are additional points in the point cloud for which attribute correction values are to be determined. If there are additional points to evaluate, the process reverts to 818 and the next point in the evaluation order is selected to be evaluated. The process may repeat steps 818-826 until all or a portion of all of the points of the point cloud have been evaluated to determine predicted attribute values and attribute correction values for the predicted attribute values.

At 828, the determined attribute correction values, the assigned attribute values, and any configuration information for decoding the compressed attribute information file, such as a parameter "K", are encoded. For example a process as described in FIG. 1B may be used to determine run-length values for points with significant attribute correction values as part of encoding the determined attribute correction values. Also, the determined run-length values may be encoded as described in FIGS. 4A-4C as part of encoding the determined attribute correction values. These techniques may further compress information representing the determined attribute correction values, such that the determined attribute correction values can be communicated using less bits than would be required to encode an attribute correction value for each attribute of each point.

Example Processes for Encoding Spatial Information

Figures 9A, 9B:
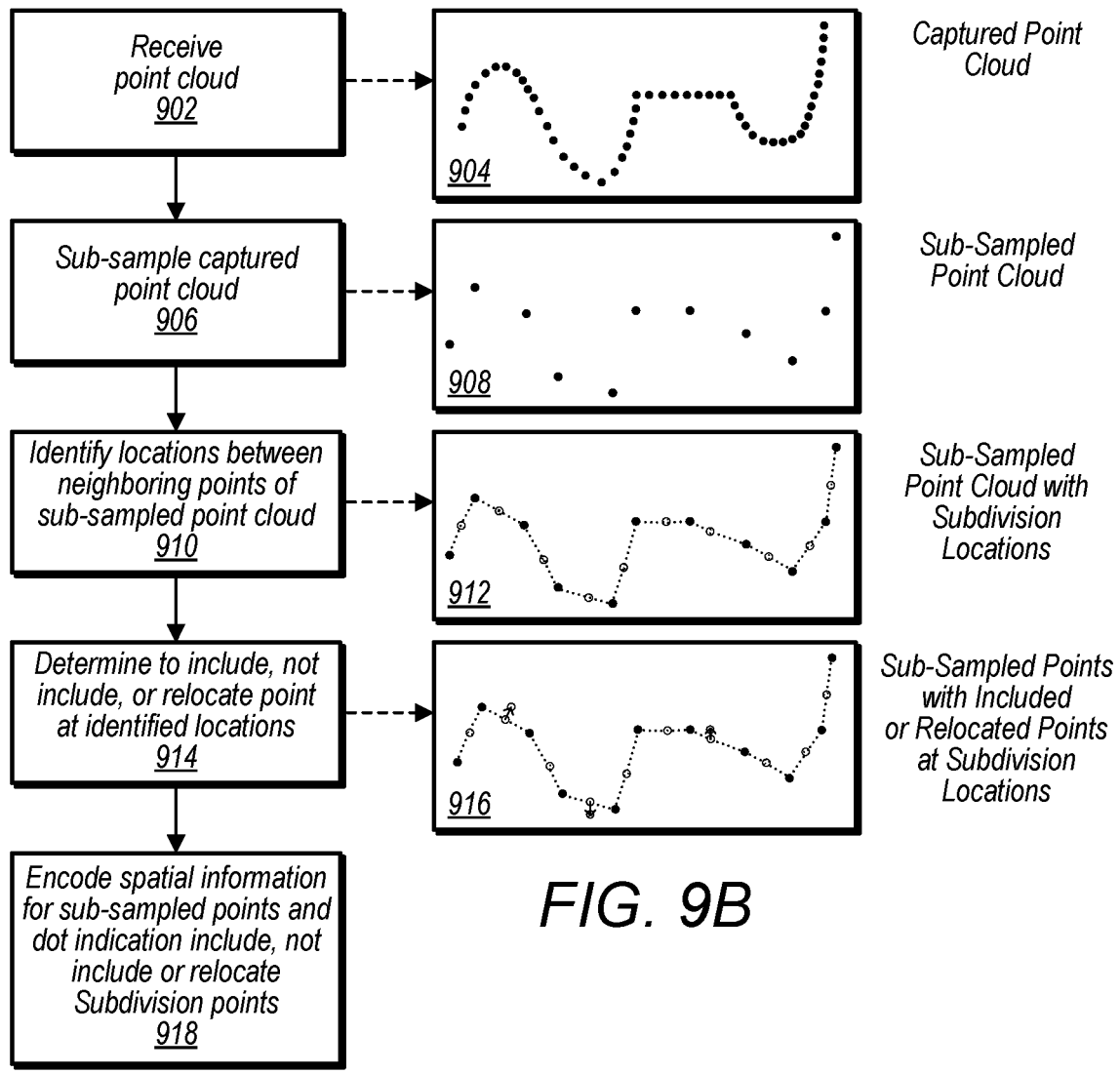
FIGS. 9A-B illustrate an example process for compressing spatial information of a set of points, such as a point cloud, according to some embodiments.

FIGS. 9A-B illustrate an example process for compressing spatial information of a point cloud, according to some embodiments.

At 902, an encoder receives a point cloud. The point cloud may be a captured point cloud from one or more sensors or may be a generated point cloud, such as a point cloud generated by a graphics application. For example, 904 illustrates points of an un-compressed point cloud.

At 906, the encoder sub-samples the received point cloud to generate a sub-sampled point cloud. The sub-sampled point cloud may include fewer points than the received point cloud. For example, the received point cloud may include hundreds of points, thousands of points, or millions of points and the sub-sampled point cloud may include tens of points, hundreds of points or thousands of points. For example, 908 illustrates sub-sampled points of a point cloud received at 902, for example a sub-sampling of the points of the point cloud in 904.

In some embodiments, the encoder may encode and decode the sub-sampled point cloud to generate a representative sub-sampled point cloud the decoder will encounter when decoding the compressed point cloud. In some embodiments, the encoder and decoder may execute a lossy compression/decompression algorithm to generate the representative sub-sampled point cloud. In some embodiments, spatial information for points of a sub-sampled point cloud may be quantized as part of generating a representative sub-sampled point cloud. In some embodiments, an encoder may utilize lossless compression techniques and encoding and decoding the sub-sampled point cloud may be omitted. For example, when using lossless compression techniques the original sub-sampled point cloud may be representative of a sub-sampled point cloud the decoder will encounter because in lossless compression data may not be lost during compression and decompression.

At 910, the encoder identifies subdivision locations between points of the sub-sampled point cloud according to configuration parameters selected for compression of the point cloud or according to fixed configuration parameters. The configuration parameters used by the encoder that are not fixed configuration parameters are communicated to an encoder by including values for the configuration parameters in a compressed point cloud. Thus, a decoder may determine the same subdivision locations as the encoder evaluated based on subdivision configuration parameters included in the compressed point cloud. For example, 912 illustrates identified sub-division locations between neighboring points of a sub-sampled point cloud.

At 914, the encoder determines for respective ones of the subdivision locations whether a point is to be included or not included at the subdivision location in a decompressed point cloud. Data indicating this determination is encoded in the compressed point cloud. In some embodiments, the data indicating this determination may be a single bit that if "true" means a point is to be included and if "false" means a point is not to be included. Additionally, an encoder may determine that a point that is to be included in a decompressed point cloud is to be relocated relative to the subdivision location in the decompressed point cloud. For example 916, shows some points that are to be relocated relative to a subdivision location. For such points, the encoder may further encode data indicating how to relocate the point relative to the subdivision location. In some embodiments, location correction information may be quantized and entropy encoded. In some embodiments, the location correction information may comprise delta X, delta Y, and/or delta Z values indicating how the point is to be relocated relative to the subdivision location. In other embodiments, the location correction information may comprise a single scalar value which corresponds to the normal component of the location correction information computed as follows:

$$\Delta N = ([X_A, Y_A, Z_A] - [X, Y, Z]) \cdot [\text{Normal Vector}]$$

In the above equation, delta N is a scalar value indicating location correction information that is the difference between the relocated or adjusted point location relative to the subdivision location (e.g. $[X_A, Y_A, Z_A]$) and the original subdivision location (e.g. $[X, Y, Z]$). The cross product of this vector difference and the normal vector at the subdivision location results in the scalar value delta N. Because a decoder can determine, the normal vector at the subdivision location, and can determine the coordinates of the subdivision location, e.g. $[X, Y, Z]$, the decoder can also determine the coordinates of the adjusted location, e.g. $[X_A, Y_A, Z_A]$, by solving the above equation for the adjusted location, which represents a relocated location for a point relative to the subdivision location. In some embodiments, the location correction information may be further decomposed into a normal component and one or more additional tangential components. In such an embodiment, the normal component, e.g. delta N, and the tangential component(s) may be quantized and encoded for inclusion in a compressed point cloud.

In some embodiments, an encoder may determine whether one or more additional points (in addition to points included at subdivision locations or points included at locations relocated relative to subdivision locations) are to be included in a decompressed point cloud. For example, if the original point cloud has an irregular surface or shape such that subdivision locations between points in the sub-sampled point cloud do not adequately represent the irregular surface or shape, the encoder may determine to include one or more additional points in addition to points determined to be included at subdivision locations or relocated relative to subdivision locations in the decompressed point cloud. Additionally, an encoder may determine whether one or more additional points are to be included in a decompressed point cloud based on system constraints, such as a target bitrate, a target compression ratio, a quality target metric, etc. In some embodiments, a bit budget may change due to changing conditions such as network conditions, processor load, etc. In such embodiments, an encoder may adjust a quantity of additional points that are encoded to be included in a decompressed point cloud based on a changing bit budget. In some embodiments, an encoder may include additional points such that a bit budget is consumed without being exceeded. For example, when a bit budget is higher, an encoder may include more additional points to consume the bit budget (and enhance quality) and when the bit budget is less, the encoder may include fewer additional points such that the bit budget is consumed but not exceeded.

In some embodiments, an encoder may further determine whether additional subdivision iterations are to be performed. If so, the points determined to be included, relocated, or additionally included in a decompressed point cloud are taken into account and the process reverts to 910 to identify new subdivision locations of an updated sub-sampled point cloud that includes the points determined to be included, relocated, or additionally included in the decompressed point cloud. In some embodiments, a number of subdivision iterations to be performed (N) may be a fixed or configurable parameter of an encoder. In some embodiments, different subdivision iteration values may be assigned to different portions of a point cloud. For example, an encoder may take into account a point of view from which the point cloud is being viewed and may perform more subdivision iterations on points of the point cloud in the foreground of the point cloud as viewed from the point of view and fewer subdivision iterations on points in a background of the point cloud as viewed from the point of view.

At 918, the spatial information for the sub-sampled points of the point cloud are encoded. Additionally, subdivision location inclusion and relocation data is encoded. Additionally, any configurable parameters selected by the encoder or provided to the encoder from a user are encoded. The compressed point cloud may then be sent to a receiving entity as a compressed point cloud file, multiple compressed point cloud files, or may be packetized and communicated via multiple packets to a receiving entity, such as a decoder or a storage device. In some embodiments, a compressed point cloud may comprise both compressed spatial information and compressed attribute information. In other embodiments, compressed spatial information and compressed attribute information may be included is separate compressed point cloud files.

Figure 10:
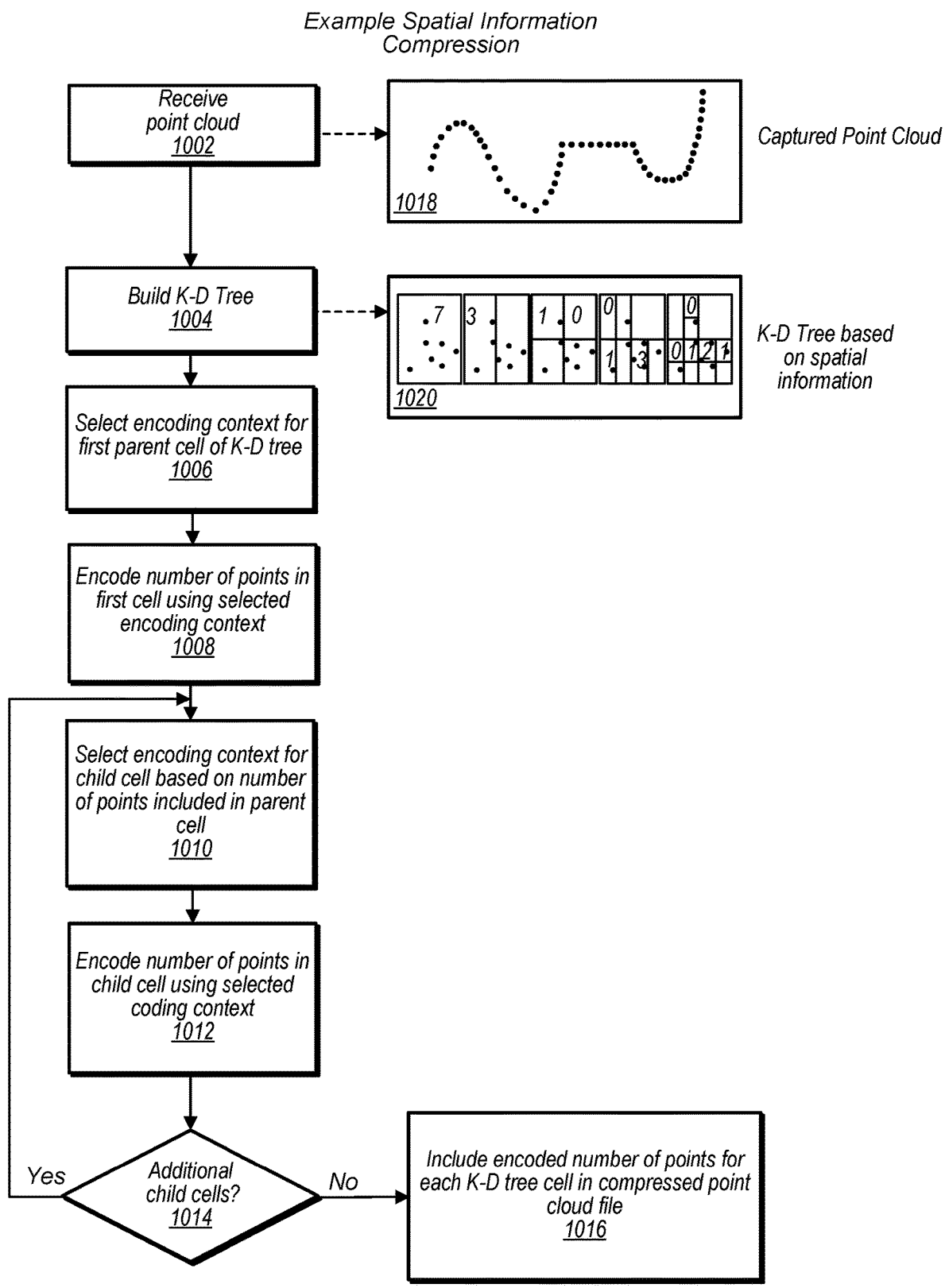
FIG. 10 illustrates another example process for compressing spatial information of a set of points, such as a point cloud, according to some embodiments.

FIG. 10 illustrates another example process for compressing spatial information of a point cloud, according to some embodiments.

In some embodiments, other spatial information compression techniques other than the sub-sampling and prediction spatial information technique described in FIGS. 6A-B may be used. For example, a spatial encoder, such as spatial encoder 204, or a spatial decoder, such as spatial decoder 222, may utilize other spatial information compression techniques, such as a K-D tree spatial information compression technique. For example, compressing spatial information at 406 of FIG. 4 may be performed using a sub-sampling and prediction technique similar to what is described in FIGS. 6A-B, may be performed using a K-D tree spatial information compression technique similar to what is described in FIG. 10, or may be performed using another suitable spatial information compression technique.

In a K-D tree spatial information compression technique, a point cloud comprising spatial information may be received at 1002. In some embodiments, the spatial information may have been previously quantized or may further be quantized after being received. For example 1018 illustrates a captured point cloud that may be received at 1002. For simplicity, 1018 illustrates a point cloud in two dimensions. However, in some embodiments, a received point cloud may include points in 3-D space.

At 1004, a K-dimensional tree or K-D tree is built using the spatial information of the received point cloud. In some embodiments, a K-D tree may be built by dividing a space, such as a 1-D, 2-D, or 3-D space of a point cloud in half in a predetermined order. For example, a 3-D space comprising points of a point cloud may initially be divided in half via a plane intersecting one of the three axis, such as the X-axis. A subsequent division may then divide the resulting space along another one of the three axis, such as the Y-axis. Another division may then divide the resulting space along another one of the axis, such as the Z-axis. Each time a division is performed a number of points included in a child cell created by the division may be recorded. In some embodiments, only a number of points in one child cell of two child cells resulting from a division may be recorded. This is because a number of points included in the other child cell can be determined by subtracting the number of points in the recorded child cell from a total number of points in a parent cell prior to the division.

A K-D tree may include a sequence of number of points included in cells resulting from sequential divisions of a space comprising points of a point cloud. In some embodiments, building a K-D tree may comprise continuing to subdivide a space until only a single point is included in each lowest level child cell. A K-D tree may be communicated as a sequence of number of points in sequential cells resulting from sequential divisions. A decoder may be configured with information indicating the subdivision sequence followed by an encoder. For example, an encoder may follow a predefined division sequence until only a single point remains in each lowest level child cell. Because the decoder may know the division sequence that was followed to build the K-D tree and the number of points that resulted from each subdivision (which is communicated to the decoder as compressed spatial information) the decoder may be able to reconstruct the point cloud.

For example, 1020 illustrates a simplified example of K-D compression in a two-dimensional space. An initial space includes seven points. This may be considered a first parent cell and a K-D tree may be encoded with a number of points "7" as a first number of the K-D tree indicating that there are seven total points in the K-D tree. A next step may be to divide the space along the X-axis resulting in two child cells, a left child cell with three points and a right child cell with four points. The K-D tree may include the number of points in the left child cell, for example "3" as a next number of the K-D tree. Recall that the number of points in the right child cell can be determined based on subtracting the number of points in the left child cell from the number of points in the parent cell. A further step may be to divide the space an additional time along the Y-axis such that each of the left and right child cells are divided in half into lower level child cells. Again, a number of points included in the left lower-level child cells may be included in a K-D tree, for example "0" and "1". A next step may then be to divide the non-zero lower-level child cells along the X-axis and record the number of points in each of the lower-level left child cells in a K-D tree. This process may continue until only a single point remains in a lowest level child cell. A decoder may utilize a reverse process to recreate a point cloud based on receiving a sequence of point totals for each left child cell of a K-D tree.

At 1006, an encoding context for encoding a number of points for a first cell of the K-D tree, for example the parent cell comprising seven points, is selected. In some embodiments, a context store may store hundreds or thousands of encoding contexts. In some embodiments, cells comprising more points than a highest number of points encoding context may be encoded using the highest number point encoding context. In some embodiments, an encoding context may include arithmetic encoding, Golomb exponential encoding, or a combination of the two. In some embodiments, other encoding techniques may be used. In some embodiments, an arithmetic encoding context may include probabilities for particular symbols, wherein different arithmetic encoding contexts include different symbol probabilities.

At 1008, the number of points for the first cell is encoded according the selected encoding context.

At 1010, an encoding context for encoding a child cell is selected based on a number of points included in a parent cell. The encoding context for the child cell may be selected in a similar manner as for the parent cell at 1006.

At 1012, the number of points included in the child cell is encoded according the selected encoding context, selected at 1010. At 1014, it is determined if there are additional lower-level child cells to encode in the K-D tree. If so, the process reverts to 1010. If not, at 1016, the encoded number of points in the parent cell and the child cells are included in a compressed spatial information file, such as a compressed point cloud. The encoded values are ordered in the compressed spatial information file such that the decoder may reconstruct the point cloud based on the number of points of each parent and child cell and the order in which the number of points of the respective cells are included in the compressed spatial information file.

In some embodiments, the number of points in each cell may be determined and subsequently encoded as a group at 1016. Or, in some embodiments, a number of points in a cell may be encoded subsequent to being determined without waiting for all child cell point totals to be determined.

Level of Detail Attribute Compression

In some circumstances, a number of bits needed to encode attribute information for a point cloud may make up a significant portion of a bit stream for the point cloud. For example, the attribute information may make up a larger portion of the bit stream than is used to transmit compressed spatial information for the point cloud.

In some embodiments, spatial information may be used to build a hierarchical Level of Detail (LOD) structure. The LOD structure may be used to compress attributes associated with a point cloud. The LOD structure may also enable advanced functionalities such as progressive/view-dependent streaming and scalable rendering. For example, in some embodiments, compressed attribute information may be sent (or decoded) for only a portion of the point cloud (e.g. a level of detail) without sending (or decoding) all of the attribute information for the whole point cloud.

Figure 11:
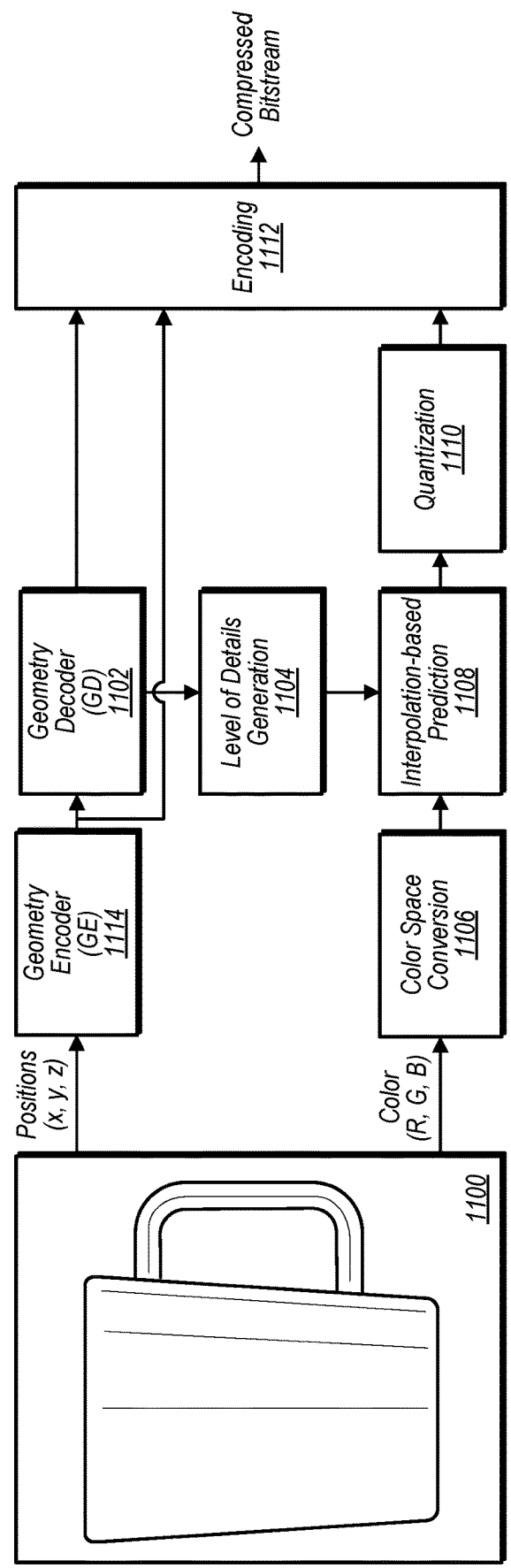
FIG. 11 illustrates components an example encoder that generates a hierarchical level of detail (LOD) structure, according to some embodiments.

FIG. 11 illustrates an example encoding process that generates a hierarchical LOD structure, according to some embodiments. For example, in some embodiments, an encoder such as encoder 602 may generate compressed attribute information in a LOD structure using a similar process as shown in FIG. 11.

In some embodiments, geometry information (also referred to herein as "spatial information") may be used to efficiently predict attribute information. For example, in FIG. 11 the compression of color information is illustrated. However, a LOD structure may be applied to compression of any type of attribute (e.g., reflectance, texture, modality, etc.) associated with points of a point cloud. Note that a pre-encoding step which applies color space conversion or updates the data to make the data better suited for compression may be performed depending on the attribute to be compressed.

In some embodiments, attribute information compression according to a LOD process proceeds as described below.

For example, let Geometry (G)={Point-P(0), P(1), ... P(N−1)} be reconstructed point cloud positions generated by a spatial decoder included in an encoder (geometry decoder GD 1102) after decoding a compressed geometry bit stream produced by a geometry encoder, also included in the encoder (geometry encoder GE 1114), such as spatial encoder 604 (illustrated in FIG. 6A). For example, in some embodiments, an encoder such as encoder 602 (illustrated in FIG. 6A) may include both a geometry encoder, such as geometry encoder 1114, and a geometry decoder, such as geometry decoder 1102. In some embodiments, a geometry encoder may be part of spatial encoder 614 and a geometry decoder may be part of prediction/correction evaluator 606, both as illustrated in FIG. 6A.

In some embodiments, the decompressed spatial information may describe locations of points in 3D space, such as X, Y, and Z coordinates of the points that make up mug 1100. Note that spatial information may be available to both an encoder, such as encoder 602, and a decoder, such as decoder 620. For example various techniques, such as K-D tree compression, octree compression, nearest neighbor prediction, etc., may be used to compress and/or encode spatial information for mug 1100 and the spatial information may be sent to a decoder with, or in addition to, compressed attribute information for attributes of the points that make up a point cloud for mug, such as a point cloud 1100.

In some embodiments, a deterministic re-ordering process may be applied on both an encoder side (such as at encoder 602) and at a decoder side (such as at decoder 620) in order to organize points of a point cloud, such as the points that represent mug 1100, into a set of Level of Details (LODs). For example, levels of detail may be generated by a level of detail generator 1104, which may be included in a prediction/correction evaluator of an encoder, such as prediction/correction evaluator 606 of encoder 602 as illustrated in FIG. 6A. In some embodiments, a level of detail generator 1104 may be a separate component of an encoder, such as encoder 602. For example, level of detail generator 1104 may be a separate component of encoder 602. Note that, in some embodiments, no additional information needs to be included in the bit stream to generate such LOD structures, except for the parameters of the LOD generation algorithm, For example, parameters that may be included in a bit stream as parameters of the LOD generator algorithm may include:
  i. The maximum number of LODs to be generated denoted by "N" (e.g., N=6),
  ii. The initial sampling distance "D0" (e.g., D0=64), and
  iii. The sampling distance update factor "f" (e.g., ½).

In some embodiments, the parameters N, D0 and f, may be provided by a user, such as an engineer configuring a compression process. In some embodiments the parameters N, D0 and f, may be determined automatically by an encoder/and or decoder using an optimization procedure, for example. These parameters may be fixed or adaptive.

In some embodiments, LOD generation may proceed as follows:
  a. Points of geometry G (e.g. the points of the point cloud organized according to the spatial information), such as points of mug 800, are marked as non-visited and a set of visited points V is set to be empty.
  b. The LOD generation process may then proceed iteratively. At each iteration j, the level of detail for that refinement level, e.g. LOD(j), may be generated as follows:
    1. The sampling distance for the current LOD, denoted D(j) may be set as follows:
      a. If j=0, then D(j)=D0.
      b. If j>0 and j<N, then D(j)=D(j−1)*f.
      c. if j=N, then D(j)=0.
    2. The LOD generation process iterates over all the points of G.
      a. At the point evaluation iteration i, a point P(i) is evaluated,
        i. if the point P(i) has been visited then it is ignored and the algorithm jumps to the next iteration (i+1), e.g. the next point P(i+1) is evaluated.
        ii. Otherwise, the distance D(i, V), defined as the minimum distance from P(i) over all the points of V, is computed. Note that V is the list of points that have already been visited. If V is empty, the distance D(i, V) is set to 0, meaning that the distance from point P(i) to the visited points is zero because there are not any visited points in the set V. If the shortest distance from point P(i) to any of the already visited point, D(i, V), is strictly higher than a parameter D0, then the point is ignored and the LoD generation jumps to the iteration (i+1) and evaluates the next point P(i+1). Otherwise, P(i) is marked as a visited point and the point P(i) is added to the set of visited points V.
      b. This process may be repeated until all the points of geometry G are traversed.
    3. The set of points added to V during the iteration j describes the refinement level R(j).
    4. The LOD(j) may be obtained by taking the union of all the refinement levels R(0), R(1), ... , R(j).

In some embodiments, the process described above, may be repeated until all the LODs are generated or all the vertices have been visited.

In some embodiments, an encoder as described above may further include a quantization module (not shown) that quantizes geometry information included in the "positions (x,y,z) being provided to the geometry encoder 1114. Furthermore, in some embodiments, an encoder as described above may additionally include a module that removes duplicated points subsequent to quantization and before the geometry encoder 1114.

In some embodiments, quantization may further be applied to compressed attribute information, such as attribute correction values and/or one or more attribute value starting points. For example quantization is performed at 1110 to attribute correction values determined by interpolation-based prediction module 1108. Quantization techniques may include uniform quantization, uniform quantization with a dead zone, non-uniform/non-linear quantization, trellis quantization, or other suitable quantization techniques.

Example Level of Detail Hierarchy

FIG. 12A illustrates an example LOD, according to some embodiments. Note that the LOD generation process may generate uniformly sampled approximations (or levels of detail) of the original point cloud, that get refined as more and more points are included. Such a feature makes it particularly adapted for progressive/view-dependent transmission and scalable rendering. For example, 1204 may include more detail than 1202, and 1206 may include more detail than 1204. Also, 1208 may include more detail than 1202, 1204, and 1206.

The hierarchical LOD structure may be used to build an attribute prediction strategy. For example, in some embodiments the points may be encoded in the same order as they were visited during the LOD generation phase. Also, in some embodiments LODs may be generated concurrently with determining an attribute prediction strategy. Attributes of each point may be predicted by using the K-nearest neighbors that have been previously encoded. In some embodiments, "K" is a parameter that may be defined by the user or may be determined by using an optimization strategy. "K" may be static or adaptive. In the latter case where "K" is adaptive, extra information describing the parameter may be included in the bit stream.

In some embodiments, different prediction strategies may be used. For example, one of the following interpolation strategies may be used, as well as combinations of the following interpolation strategies, or an encoder/decoder may adaptively switch between the different interpolation strategies. The different interpolation strategies may include interpolation strategies such as: inverse-distance interpolation, barycentric interpolation, natural neighbor interpolation, moving least squares interpolation, or other suitable interpolation techniques. For example, interpolation based prediction may be performed at an interpolation-based prediction module 1108 included in a prediction/correction value evaluator of an encoder, such as prediction/correction value evaluator 606 of encoder 602. Also, interpolation based prediction may be performed at an interpolation-based prediction module 1108 included in a prediction evaluator of a decoder, such as prediction evaluator 624 of decoder 620. In some embodiments, a color space may also be converted, at color space conversion module 1106, prior to performing interpolation based prediction. In some embodiments, a color space conversion module 1106 may be included in an encoder, such as encoder 602. In some embodiments, a decoder may further included a module to convert a converted color space, back to an original color space.

In some embodiments, quantization may further be applied to attribute information. For example quantization may performed at quantization module 1110. In some embodiments, an encoder, such as encoder 602, may further include a quantization module 1110. Quantization techniques employed by a quantization module 1110 may include uniform quantization, uniform quantization with a dead zone, non-uniform/non-linear quantization, trellis quantization, or other suitable quantization techniques.

Furthermore, attribute correction values may be determined based on comparing the interpolation-based prediction values determined at interpolation-based prediction module 1108 to original non-compressed attribute values. The attribute correction values may further be quantized at quantization module 1110 and the quantized attribute correction values, encoded spatial information (output from the geometry encoder 1102) and any configuration parameters used in the prediction may be encoded at encoding module 1112. In some embodiments, the encoding module, may use a context adaptive encoding technique. In some embodiments, the encoding module 1112 may perform a similar process as described in FIGS. 1B-4C for each level of detail.

The compressed point cloud may then be provided to a decoder, such as decoder 620, and the decoder may determine similar levels of detail and perform interpolation based prediction to recreate the original point cloud based on the quantized attribute correction values, encoded spatial information (output from the geometry encoder 1102) and the configuration parameters used in the prediction at the encoder.

FIG. 12B illustrates an example compressed point cloud file comprising LODs, according to some embodiments. Level of detail attribute information file 1250 includes configuration information 1252, point cloud data 1254, and level of detail point attribute correction values 1256. In some embodiments, level of detail attribute information file 1250 may be communicated in parts via multiple packets. In some embodiments, not all of the sections shown in the level of detail attribute information file 1250 may be included in each packet transmitting compressed attribute information. In some embodiments, a level of detail attribute information file, such as level of detail attribute information file 1250, may be stored in a storage device, such as a server that implements an encoder or decoder, or other computing device.

Figure 13:
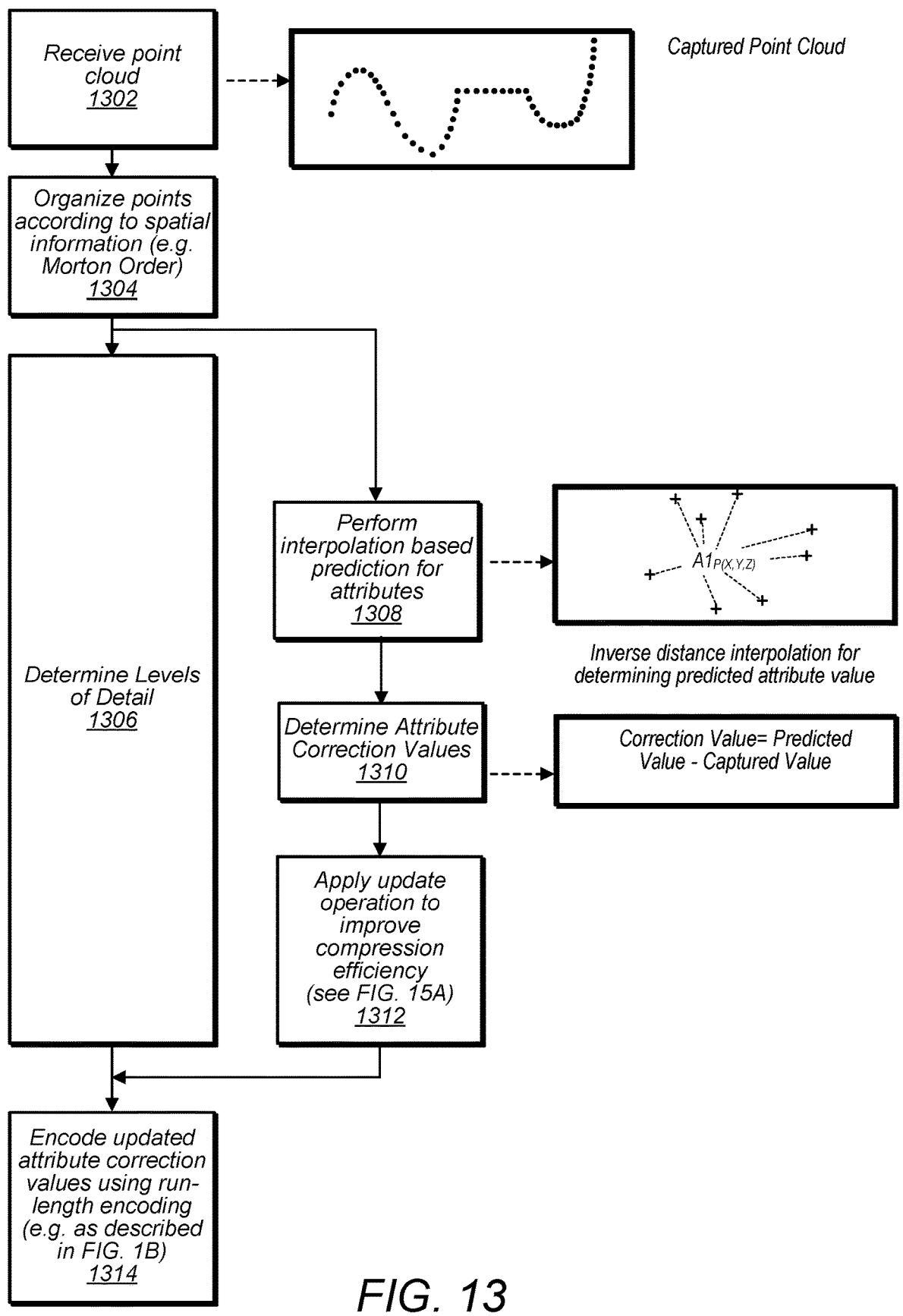
FIG. 13 illustrates an example process of compressing attribute values using a bottom-up level of detail encoding process, according to some embodiments.

FIG. 13 illustrates a method of compressing attribute information of a point cloud using an update operation, according to some embodiments.

At 1302, a point cloud is received by an encoder. The point cloud may be captured, for example by one or more sensors, or may be generated, for example in software.

At 1304, the points of the point cloud are ordered in an order based on the respective positions of the points along a space-filling curve that fills a 3D space of the point cloud. For example, a first point encountered along a patch of the space-filling curve may be ordered as a starting point and a next point encountered along the space-filling curve may be ordered as a second point in the order according to the space filling curve. The points of the point cloud are assigned index values according to the order of the points along the space filing curve. For example the starting point may be given an index value of "1" and the next point encountered may be given an index value of "2", etc.

At 1306, one or more level of details are generated, as described herein. Note that in some embodiments, the spatial information used at 1304 to determine the order according to the space-filling curve may have been encoded or compressed and de-coded or decompressed to generate a representative decompressed point cloud geometry that a decoder would encounter.

At 1308, an interpolation based prediction is performed to predict attribute values for the attributes of the points of the point cloud. At 1310, attribute correction values are determined based on comparing the predicted attribute values to original attribute values. For example, in some embodiments, an interpolation based prediction may be performed for each level of detail to determine predicted attribute values for points included in the respective levels of detail. These predicted attribute values may then be compared to attribute values of the original point cloud prior to compression to determine attribute correction values for the points of the respective levels of detail. For example, an interpolation based prediction process as described in FIG. 8 may be used to determine predicted attribute values for various levels of detail. In some embodiments, attribute correction values may be determined for multiple levels of detail of a LOD structure. For example a first set of attribute correction values may be determined for points included in a first level of detail and additional sets of attribute correction values may be determined for points included in other levels of detail.

At 1312, an update operation may optionally be applied that affects the attribute correction values determined at 1310. Performance of the update operation is discussed in more detail below in FIG. 15A-B.

In some embodiments, levels of detail may be determined using a bottom-up approach, wherein a lowest level of detail comprising a sparse number of points is determined first and subsequent levels of detail add points to each preceding level of detail, such that each subsequent level of detail includes all the points of the preceding level of detail plus additional points that have been added for the subsequent level of detail to further refine the preceding level of detail.

In some embodiments, after determine points to include in a first level of detail or a subsequent level of detail an encoder may determine predicted attribute values and attribute correction values for the first or subsequent level of detail while continuing to determine points to include in additional levels of detail. For example, an encoder may concurrently determine points to include in higher levels of detail while determining attribute correction values or updated attribute correction values to encode for lower levels of detail.

At 1314, attribute correction values, LOD parameters, encoded spatial information (output from the geometry encoder) and any configuration parameters used in the prediction are encoded, as described herein. For example, the attribute correction values for each level of detail may be encoded using run-length values for runs of points with significant attribute correction values as described in FIG. 1B and the run-length values may be encoded as described in FIGS. 4A-4C.

In some embodiments, the attribute information encoded at 1314 may include attribute information for multiple or all levels of detail of the point cloud, or may include attribute information for a single level of detail or fewer than all levels of detail of the point cloud. In some embodiments, level of detail attribute information may be sequentially encoded by an encoder. For example, an encoder may make available a first level of detail before encoding attribute information for one or more additional levels of detail.

Example Decoding Process for Bottom-Up LODs

Figure 14:
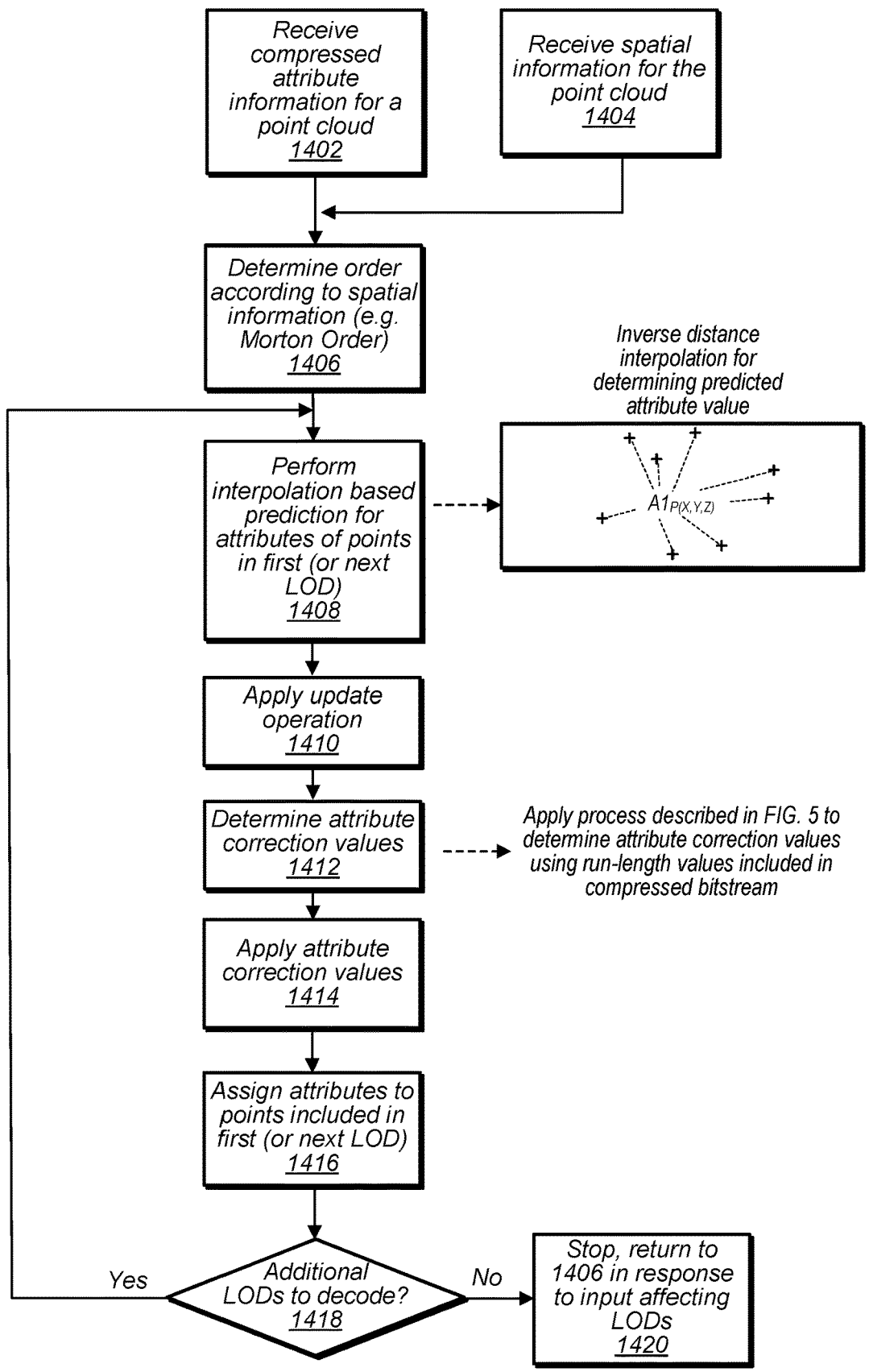
FIG. 14 illustrates an example process of re-constructing attribute values for a set of points, such as in a point cloud, that were compressed using a bottom-up level of detail encoding process, according to some embodiments.

FIG. 14 illustrates a method of decoding attribute information of a point cloud, according to some embodiments.

At 1402, compressed attribute information for a point cloud is received at a decoder. Also, at 1404 spatial information for the point cloud is received at the decoder. In some embodiments, the spatial information may be compressed or encoded using various techniques, such as a K-D tree, Octree, neighbor prediction, etc. and the decoder may decompress and/or decode the received spatial information at 1404.

At 1406, the decoder determines an order of the points of the point cloud based on a space-filling curve. For example, the decoder may recreate a spatial representation of the point cloud based on the spatial information received at 1404 and determine Morton codes of the points of the point cloud. Also the decoder may determine which level of detail of a number of levels of detail to decompress/decode first or next. The selected level of detail to decompress/decode may be determined based on a viewing mode of the point cloud. For example, a point cloud being viewed in a preview mode may require fewer levels of detail to be determined than a point cloud being viewed in a full view mode. Also, a location of a point cloud in a view being rendered may be used to determine a level of detail to decompress/decode. For example, a point cloud may represent an object such as the coffee mug shown in FIG. 11. If the coffee mug is in a foreground of a view being rendered more levels of detail may be determined for the coffee mug. However, if the coffee mug is in the background of a view being rendered, fewer levels of detail may be determined for the coffee mug. In some embodiments, a number of levels of detail to determine for a point cloud may be determined based on a data budget allocated for the point cloud.

At 1408 points included in the first level of detail (or next level of detail) being determined may be determined as described herein. For the points of the level of detail being evaluated, attribute values of the points may be predicted based on an inverse distance weighted interpolation based on the k-nearest neighbors (also referred to herein as "h"-nearest neighbors for an approximate nearest neighbor search) to each point being evaluated, where k (or h) may be a fixed or adjustable parameter.

Figure 15A:
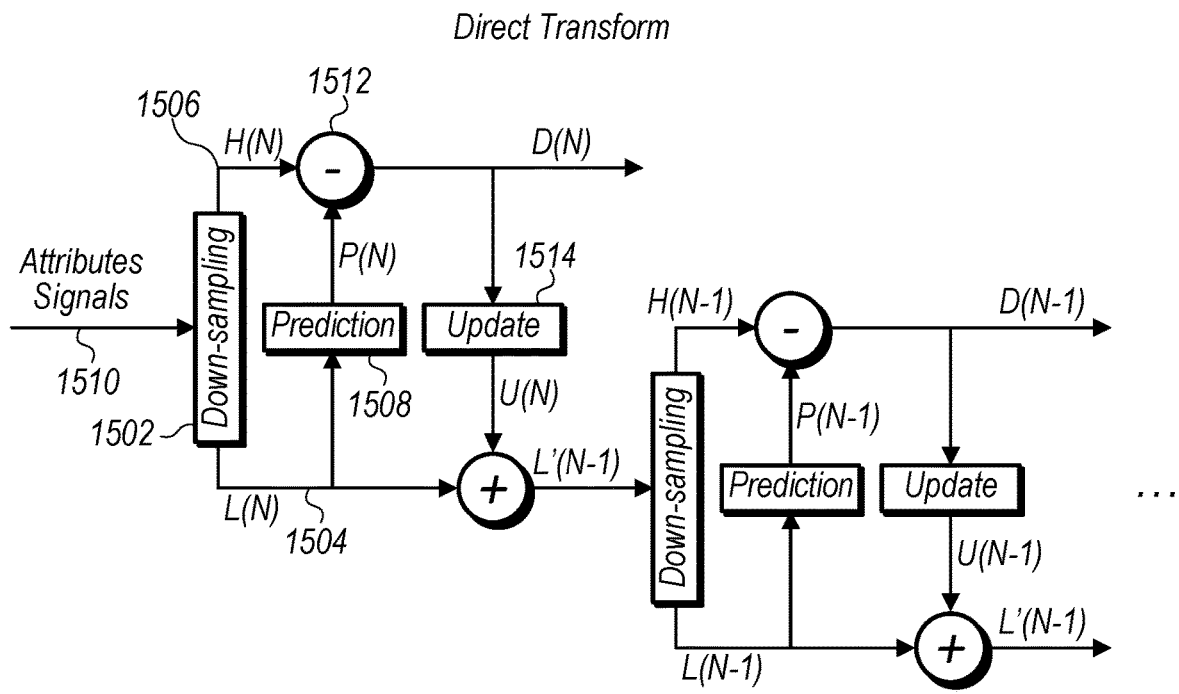
FIG. 15A illustrates a direct transformation that may be applied at an encoder to encode attribute information of a set of points, such as in a point could, according to some embodiments.
Figure 15B:
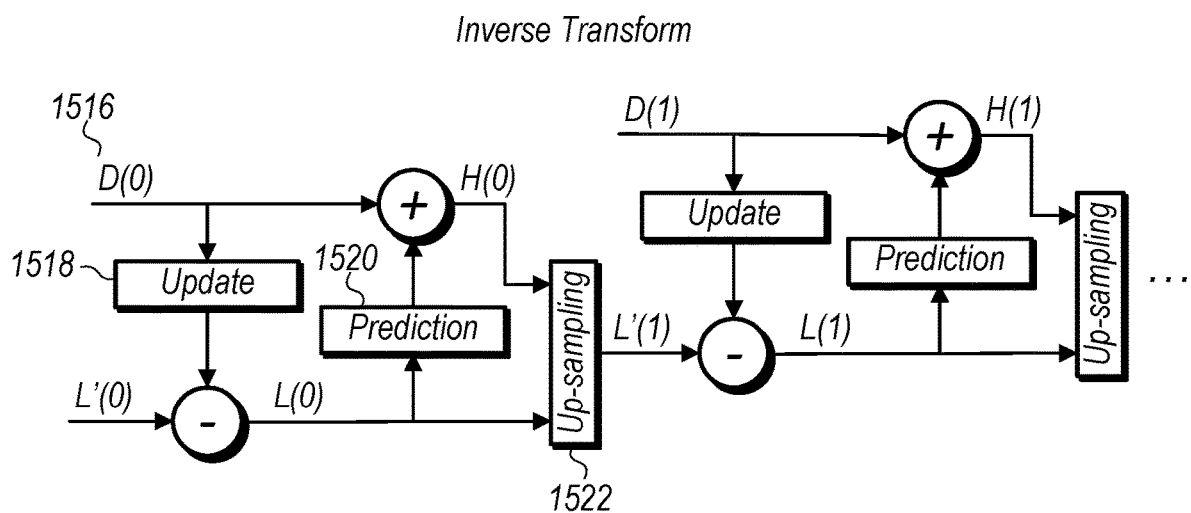
FIG. 15B illustrates an inverse transformation that may be applied at a decoder to decode attribute information of a set of points, such as in a point cloud, according to some embodiments.

At 1410, in some embodiments, an update operation may be performed on the predicted attribute values as described in more detail in FIGS. 15A-15B.

Also, the attribute information may have been compressed using run-length values for points with significant attribute coefficient values/attribute correction values. At 1412, a similar process as described in FIG. 5 may be used to decompress the compressed attribute correction values, such that the decoder has an attribute correction value for each point.

At 1414, attribute correction values determined at 1412 may be applied to correct the attribute values predicted at 1408 or the updated predicted attribute values determined at 1410.

At 1416, the corrected attribute values determined at 1414 may be assigned as attributes to the points of the first level of detail (or the current level of detail being evaluated). In some embodiments, the attribute values determined for subsequent levels of details may be assigned to points included in the subsequent levels of detail while attribute values already determined for previous levels of detail are retained by the respective points of the previous level(s) of detail. In some embodiments, new attribute values may be determined for sequential levels of detail.

In some embodiments, the spatial information received at 1404 may include spatial information for multiple or all levels of detail of the point cloud, or may include spatial information for a single level of detail or fewer than all levels of detail of the point cloud. In some embodiments, level of detail attribute information may be sequentially received by a decoder. For example, a decoder may receive a first level of detail and generate attribute values for points of the first level of detail before receiving attribute information for one or more additional levels of detail.

At 1416 it is determined if there are additional levels of detail to decode. If so, the process returns to 1408 and is repeated for the next level of detail to decode. If not the process is stopped at 1418, but may resume at 1406 in response to input affecting the number of levels of detail to determine, such as change in view of a point cloud or a zoom operation being applied to a point cloud being viewed, as a few examples of an input affecting the levels of detail to be determined.

Lifting Schemes for Level of Detail Compression and Decompression

In some embodiments, lifting schemes may be applied to point clouds. For example, a lifting scheme may be one of the transforms applied at 154 of FIG. 1B or at 202 of FIGS. 2C/2D. For example, as described below, a lifting scheme may be applied to irregular points. This is in contrast to other types of lifting schemes that may be applied to images having regular points in a plane. In a lifting scheme, for points in a current level of detail nearest points in a lower level of detail are found. These nearest points in the lower level of detail are used to predict attribute values for points in a higher level of detail. Conceptually, a graph could be made showing how points in lower levels of detail are used to determine attribute values of points in higher levels of detail. In such a conceptual view, edges could be assigned to the graph between levels of detail, wherein there is an edge between a point in a higher level of detail and each point in the lower level of detail that forms a basis for the prediction of the attribute of the point at the higher level of detail. As described in more detail below, a weight could be assigned to each of these edges indicating a relative influence. The weight may represent an influence an attribute value of the point in the lower level of detail has on the attribute value of the points in the higher level of detail. Also, multiple edges may make a path through the levels of detail and weights may be assigned to the paths. In some embodiments, the influence of a path may be defined by the sum of the weights of the edges of the path. For example, equation 1 discussed further below represents such a weighting of a path.

In a lifting scheme, attribute values for low influence points may be highly quantized and attribute values for high influence points may be quantized less. In some embodiments, a balance may be reached between quality of a reconstructed point cloud and efficiency, wherein more quantization increases compression efficiency and less quantization increases quality. In some embodiments, all paths may not be evaluated. For example, some paths with little influence may not be evaluated. Also, an update operator may smooth residual differences, e.g. predicted attribute values that are used to determine attribute correction values, in order to increase compression efficiency while taking into account relative influence or importance of points when smoothing the residual differences.

FIG. 15A illustrates a direct transformation that may be applied at an encoder to encode attribute information of a point could, according to some embodiments.

In some embodiments, an encoder may utilize a direct transformation as illustrated in FIG. 15A in order to determine attribute correction values that are encoded as part of a compressed point cloud. For example, in some embodiments a direct transformation, such as interpolation based prediction, may be utilized to determine attribute values as described in FIG. 10A at 1008 and to apply an update operation as described in FIG. 13 at 1312.

In some embodiments, a direct transform may receive attribute signals for attributes associated with points of a point cloud that is to be compressed. For example, the attributes may include color values, such as RGB colors, or other attribute values of points in a point cloud that is to be compressed. The geometry of the points of the point cloud to be compressed may also be known by the direct transform that receives the attribute signals. At 1502, the direct transform may include a split operator that splits the attribute signals 1510 for a first (or next) level of detail. For example, for a particular level of detail, such as LOD(N), comprising X number of points, a sub-sample of the attributes of the points, e.g. a sample comprising Y points, may comprise attribute values for a smaller number of points than X. Said another way, the split operator may take as an input attributes associated with a particular level of detail and generate a low resolution sample 1504 and a high resolution sample 1506. It should be noted that a LOD structure may be partitioned into refinement levels, wherein subsequent levels of refinement include attributes for more points than underlying levels of refinement. A particular level of detail as described below is obtained by taking the union of all lower level of detail refinements. For example, the level of detail j is obtained by taking the union of all refinement levels R(0), R(1), . . . , R(j). It should also be noted, as described above, that a compressed point cloud may have a total number of levels of detail N, wherein R(0) is the least refinement level of detail and R(N) is the highest refinement level of detail for the compressed point cloud.

At 1508, a prediction for the attribute values of the points not included in the low resolution sample 1504 is predicted based on the points included in the low resolution sample. For example, based on an inverse distance interpolation prediction technique or any of the other prediction techniques described above. At 1512, a difference between the predicted attribute values for the points left out of low resolution sample 1504 is compared to the actual attribute values of the points left out of the low resolution sample 1504. The comparison determines differences, for respective points, between a predicted attribute value and an actual attribute value. These differences (D(N)) are then encoded as attribute correction values for the attributes of the points included in the particular level of detail that are not encoded in the low resolution sample. For example, for the highest level of detail N, the differences D(N) may be used to adjust/correct attribute values included in lower levels of detail. Because at the highest level of detail, the attribute correction values are not used to determine attribute values of other even higher levels of detail (because for the highest level of detail, N, there are not any higher levels of detail), an update operation to account for relative importance of these attribute correction values may not be performed. As such, the differences D(N) may be used to encode attribute correction values for LOD(N).

In addition, the direct transform may be applied for subsequent lower levels of detail, such as LOD(N−1). However, before applying the direct transform for the subsequent level of detail, an update operation may be performed in order to determine the relative importance of attribute values for points of the lower level of detail on attribute values of one or more upper levels of detail. For example, update operation 1514 may determine relative importances of attribute values of attributes for points included in lower levels of detail on higher levels of detail, such as for attributes of points included in L(N). The update operator may also smooth the attributes values to improve compression efficiency of attribute correction values for subsequent levels of detail taking into account the relative importance of the respective attribute values, wherein the smoothing operation is performed such that attribute values that have a larger impact on subsequent levels of detail are modified less than points that have a lesser impact on subsequent levels of detail. Several approaches for performing the update operation are described in more detail below. The updated lower resolution sample of level of detail L'(N) is then fed to another split operator and the process repeats for a subsequent level of detail, LOD(N−1). Note that attribute signals for the lower level of detail, LOD(N−1) may also be received at the second (or subsequent) split operator.

FIG. 15B illustrates an inverse transformation that may be applied at a decoder to decode attribute information of a point cloud, according to some embodiments.

In some embodiments, a decoder may utilize an inverse transformation process as shown in FIG. 14 to reconstruct a point cloud from a compressed point cloud. For example, in some embodiments, performing prediction as described in FIG. 14 at 1408, applying an update operator as described in FIG. 14 at 1410, applying attribute correction values as described in FIG. 14 at 1414 and assigning attributes to points in a level of detail as described in FIG. 14 at 1416, may be performed according to an inverse transformation process as described in FIG. 15B.

In some embodiments, an inverse transformation process may receive an updated low level resolution sample L'(0) for a lowest level of detail of a LOD structure. The inverse transformation process may also receive attribute correction values for points not included in the updated low resolution sample L'(0). For example, for a particular LOD, L'(0) may include a sub-sampling of the points included in the LOD and a prediction technique may be used to determine other points of the LOD, such as would be included in a high resolution sample of the LOD. The attribute correction values may be received as indicated at 1506, e.g. D(0). At 1518 an update operation may be performed to account for the smoothing of the attribute correction values performed at the encoder. For example, update operation 1518 may "undo" the update operation that was performed at 1514, wherein the update operation performed at 1514 was performed to improve compression efficiency by smoothing the attribute values taking into account relative importance of the attribute values. The update operation may be applied to the updated low resolution sample L'(0) to generate an "un-smoothed" or non-updated low resolution sample, L(0). The low resolution sample L(0) may be used by a prediction technique at 1520 to determine attribute values of points not included in the low resolution sample. The predicted attribute values may be corrected using the attribute correction values, D(0), to determine attribute values for points of a high resolution sample of the LOD(0). The low resolution sample and the high resolution sample may be combined at merge operator 1522, and a new updated low resolution sample for a next level of detail L'(1) may be determined. A similar process may be repeated for the next level of detail LOD(1) as was described for LOD(0). In some embodiments, an encoder as described in FIG. 15A and a decoder as described in FIG. 15B may repeat their respective processes for N levels of detail of a point cloud.

In some embodiments, the bottom-up LODs as discussed above with regard to FIG. 13 may further be used in a lifting scheme as described in FIGS. 15A-15B.

Exampled Applications for Point Cloud Compression and Decompression

Figure 16:
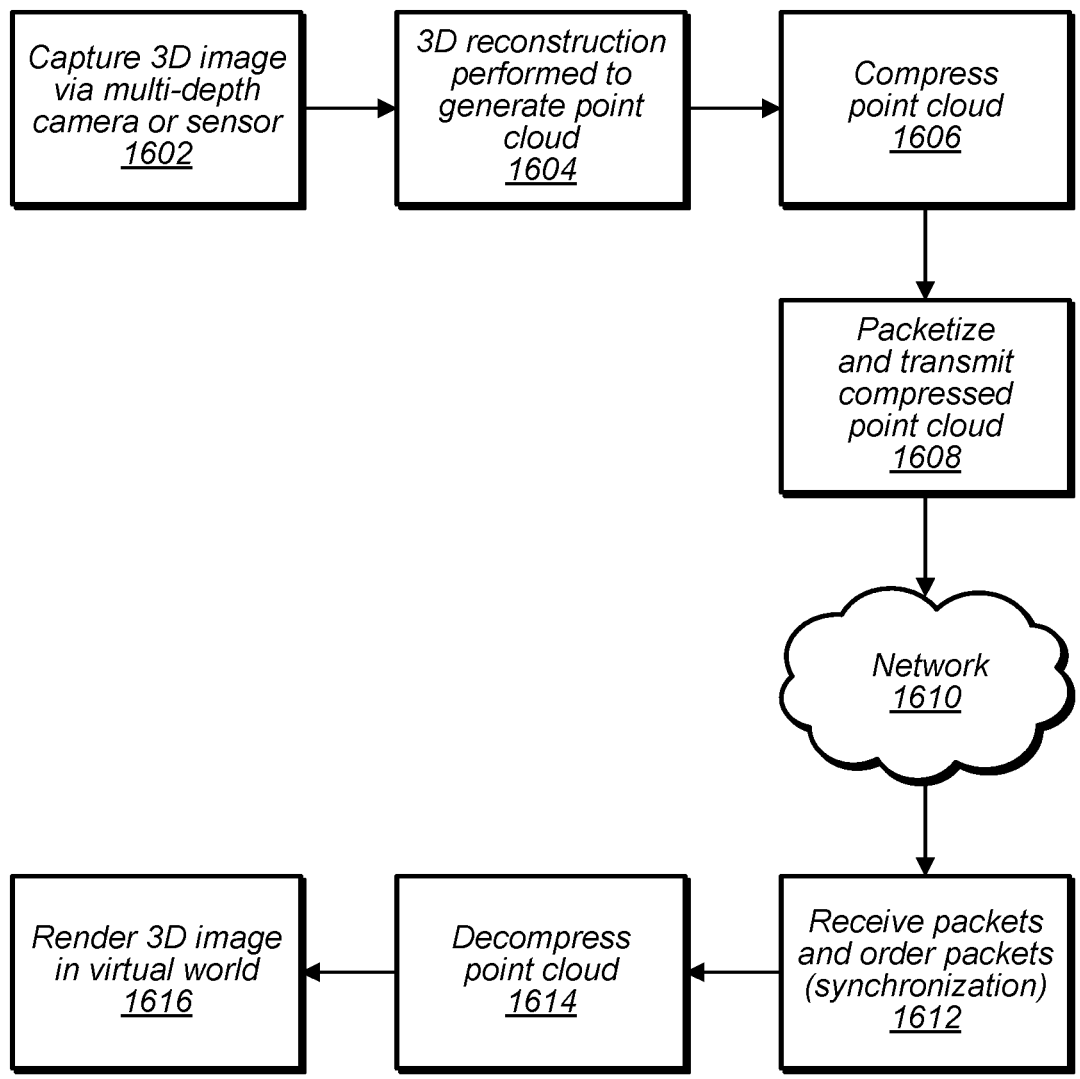
FIG. 16 illustrates compressed point cloud information being used in a 3-D telepresence application, according to some embodiments.

FIG. 16 illustrates compressed point clouds being used in a 3-D telepresence application, according to some embodiments.

In some embodiments, a sensor, such as sensor 102, an encoder, such as encoder 104 or encoder 602, and a decoder, such as decoder 116 or decoder 620, may be used to communicate point clouds in a 3-D telepresence application. For example, a sensor, such as sensor 102, at 1602 may capture a 3D image and at 1604, the sensor or a processor associated with the sensor may perform a 3D reconstruction based on sensed data to generate a point cloud.

At 1606, an encoder such as encoder 104 or 602 may compress the point cloud and at 1608 the encoder or a post processor may packetize and transmit the compressed point cloud, via a network 1610. At 1612, the packets may be received at a destination location that includes a decoder, such as decoder 116 or decoder 620. The decoder may decompress the point cloud at 1614 and the decompressed point cloud may be rendered at 1616. In some embodiments a 3-D application may transmit point cloud data in real time such that a display at 1616 represents images being observed at 1602. For example, a camera in a canyon may allow a remote user to experience walking through a virtual canyon at 1616.

Figure 17:
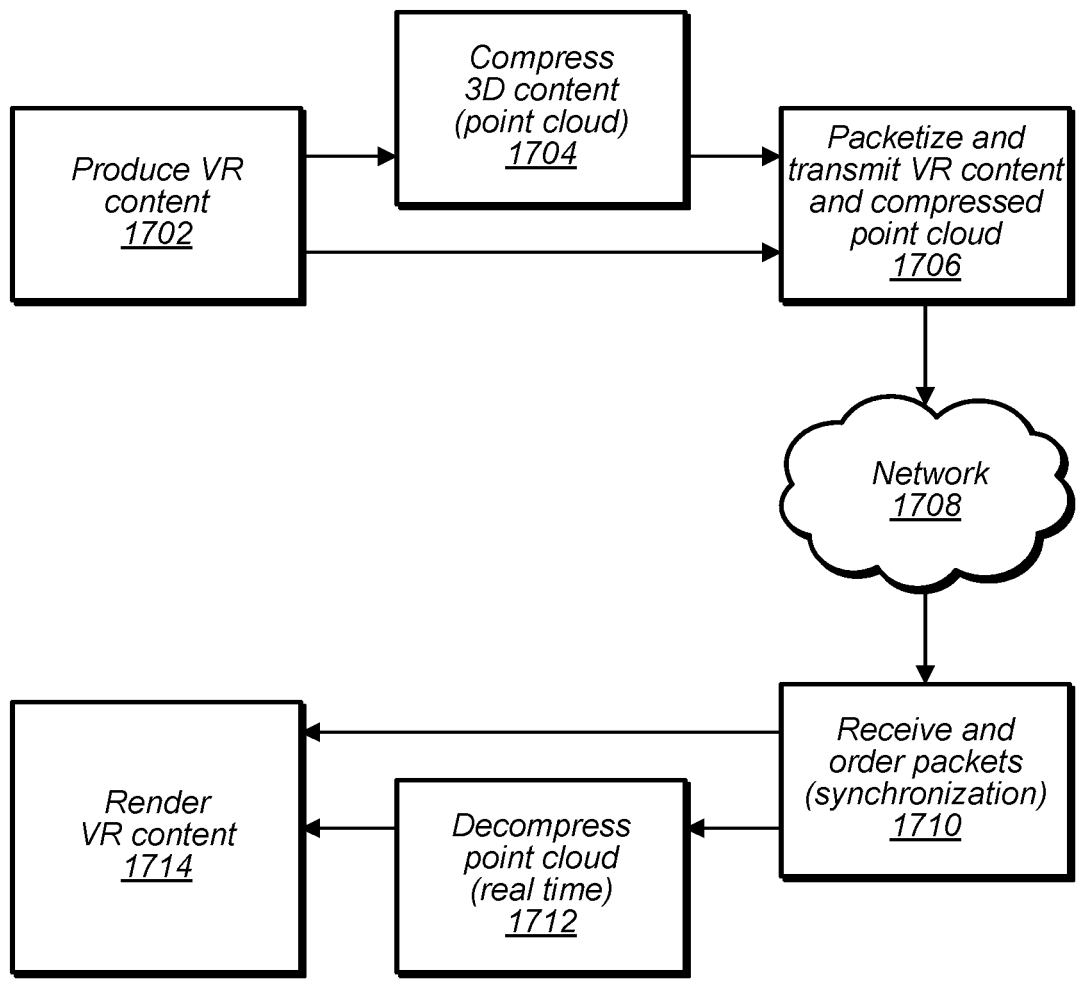
FIG. 17 illustrates compressed point cloud information being used in a virtual reality application, according to some embodiments.

FIG. 17 illustrates compressed point clouds being used in a virtual reality (VR) or augmented reality (AR) application, according to some embodiments.

In some embodiments, point clouds may be generated in software (for example as opposed to being captured by a sensor). For example, at 1702 virtual reality or augmented reality content is produced. The virtual reality or augmented reality content may include point cloud data and non-point cloud data. For example, a non-point cloud character may traverse a landscape represented by point clouds, as one example. At 1704, the point cloud data may be compressed and at 1706 the compressed point cloud data and non-point cloud data may be packetized and transmitted via a network 1708. For example, the virtual reality or augmented reality content produced at 1702 may be produced at a remote server and communicated to a VR or AR content consumer via network 1708. At 1710, the packets may be received and synchronized at the VR or AR consumer's device. A decoder operating at the VR or AR consumer's device may decompress the compressed point cloud at 1712 and the point cloud and non-point cloud data may be rendered in real time, for example in a head mounted display of the VR or AR consumer's device. In some embodiments, point cloud data may be generated, compressed, decompressed, and rendered responsive to the VR or AR consumer manipulating the head mounted display to look in different directions.

In some embodiments, point cloud compression as described herein may be used in various other applications, such as geographic information systems, sports replay broadcasting, museum displays, autonomous navigation, etc.

Example Computer System

Figure 18:
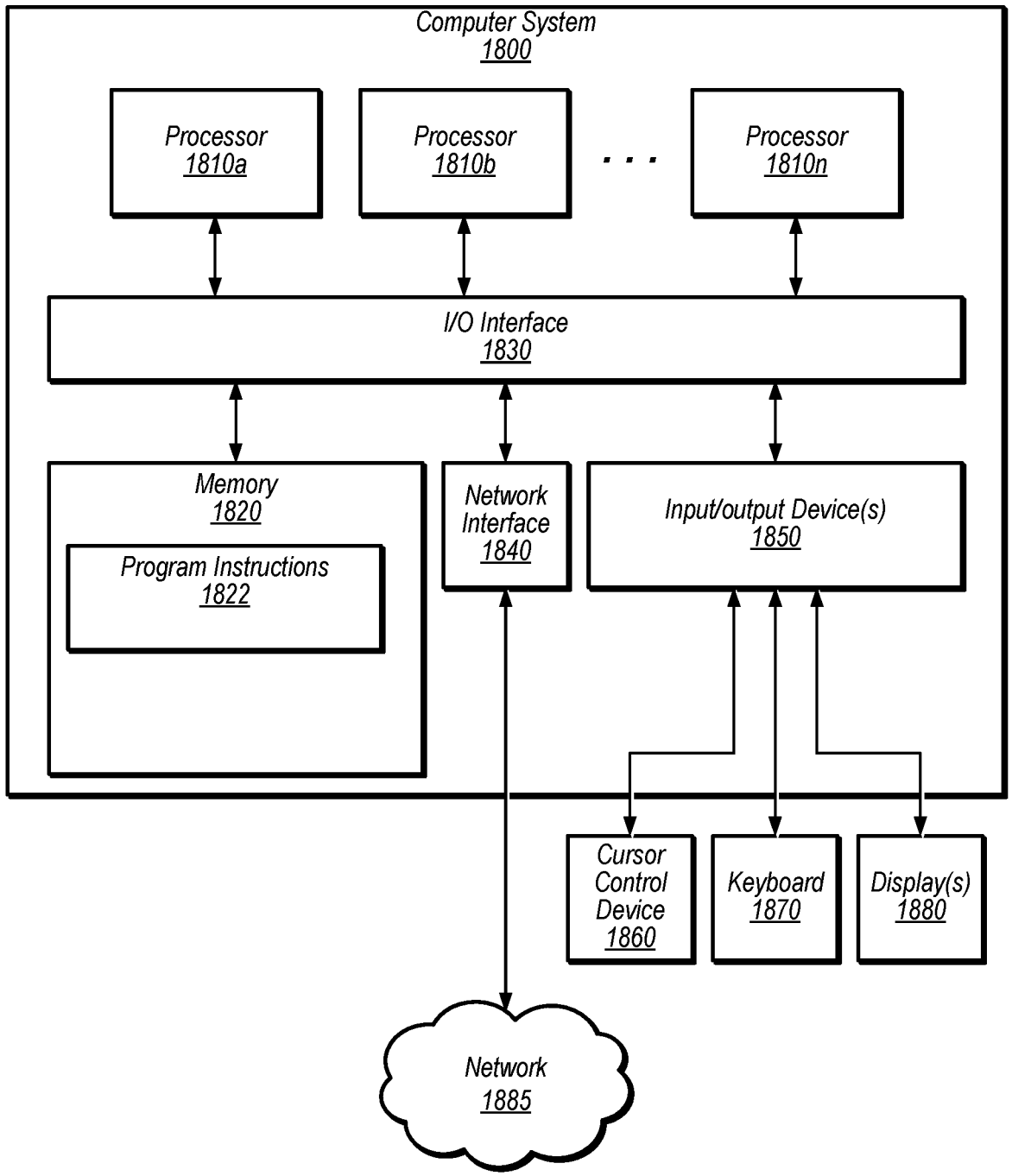
FIG. 18 illustrates an example computer system that may implement an encoder or decoder, according to some embodiments.

FIG. 18 illustrates an example computer system 1800 that may implement an encoder or decoder or any other ones of the components described herein, (e.g., any of the components described above with reference to FIGS. 1-17), in accordance with some embodiments. The computer system 1800 may be configured to execute any or all of the embodiments described above. In different embodiments, computer system 1800 may be any of various types of devices, including, but not limited to, a personal computer system, desktop computer, laptop, notebook, tablet, slate, pad, or netbook computer, mainframe computer system, handheld computer, workstation, network computer, a camera, a set top box, a mobile device, a consumer device, video game console, handheld video game device, application server, storage device, a television, a video recording device, a peripheral device such as a switch, modem, router, or in general any type of computing or electronic device.

Various embodiments of a point cloud encoder or decoder, as described herein may be executed in one or more computer systems 1800, which may interact with various other devices. Note that any component, action, or functionality described above with respect to FIGS. 1-17 may be implemented on one or more computers configured as computer system 1800 of FIG. 18, according to various embodiments. In the illustrated embodiment, computer system 1800 includes one or more processors 1810 coupled to a system memory 1820 via an input/output (I/O) interface 1830. Computer system 1800 further includes a network interface 1840 coupled to I/O interface 1830, and one or more input/output devices 1850, such as cursor control device 1860, keyboard 1870, and display(s) 1880. In some cases, it is contemplated that embodiments may be implemented using a single instance of computer system 1800, while in other embodiments multiple such systems, or multiple nodes making up computer system 1800, may be configured to host different portions or instances of embodiments. For example, in one embodiment some elements may be implemented via one or more nodes of computer system 1800 that are distinct from those nodes implementing other elements.

In various embodiments, computer system 1800 may be a uniprocessor system including one processor 1810, or a multiprocessor system including several processors 1810 (e.g., two, four, eight, or another suitable number). Processors 1810 may be any suitable processor capable of executing instructions. For example, in various embodiments processors 1810 may be general-purpose or embedded processors implementing any of a variety of instruction set architectures (ISAs), such as the x86, PowerPC, SPARC, or MIPS ISAs, or any other suitable ISA. In multiprocessor systems, each of processors 1810 may commonly, but not necessarily, implement the same ISA.

System memory 1820 may be configured to store point cloud compression or point cloud decompression program instructions 1822 and/or sensor data accessible by processor 1810. In various embodiments, system memory 1820 may be implemented using any suitable memory technology, such as static random access memory (SRAM), synchronous dynamic RAM (SDRAM), nonvolatile/Flash-type memory, or any other type of memory. In the illustrated embodiment, program instructions 1822 may be configured to implement an image sensor control application incorporating any of the functionality described above. In some embodiments, program instructions and/or data may be received, sent or stored upon different types of computer-accessible media or on similar media separate from system memory 1820 or computer system 1800. While computer system 1800 is described as implementing the functionality of functional blocks of previous Figures, any of the functionality described herein may be implemented via such a computer system.

In one embodiment, I/O interface 1830 may be configured to coordinate I/O traffic between processor 1810, system memory 1820, and any peripheral devices in the device, including network interface 1840 or other peripheral interfaces, such as input/output devices 1850. In some embodiments, I/O interface 1830 may perform any necessary protocol, timing or other data transformations to convert data signals from one component (e.g., system memory 1820) into a format suitable for use by another component (e.g., processor 1810). In some embodiments, I/O interface 1830 may include support for devices attached through various types of peripheral buses, such as a variant of the Peripheral Component Interconnect (PCI) bus standard or the Universal Serial Bus (USB) standard, for example. In some embodiments, the function of I/O interface 1830 may be split into two or more separate components, such as a north bridge and a south bridge, for example. Also, in some embodiments some or all of the functionality of I/O interface 1830, such as an interface to system memory 1820, may be incorporated directly into processor 1810.

Network interface 1840 may be configured to allow data to be exchanged between computer system 1800 and other devices attached to a network 1885 (e.g., carrier or agent devices) or between nodes of computer system 1800. Network 1885 may in various embodiments include one or more networks including but not limited to Local Area Networks (LANs) (e.g., an Ethernet or corporate network), Wide Area Networks (WANs) (e.g., the Internet), wireless data networks, some other electronic data network, or some combination thereof. In various embodiments, network interface 1840 may support communication via wired or wireless general data networks, such as any suitable type of Ethernet network, for example; via telecommunications/telephony networks such as analog voice networks or digital fiber communications networks; via storage area networks such as Fibre Channel SANs, or via any other suitable type of network and/or protocol.

Input/output devices 1850 may, in some embodiments, include one or more display terminals, keyboards, keypads, touchpads, scanning devices, voice or optical recognition devices, or any other devices suitable for entering or accessing data by one or more computer systems 1800. Multiple input/output devices 1850 may be present in computer system 1800 or may be distributed on various nodes of computer system 1800. In some embodiments, similar input/output devices may be separate from computer system 1800 and may interact with one or more nodes of computer system 1800 through a wired or wireless connection, such as over network interface 1840.

As shown in FIG. 18, memory 1820 may include program instructions 1822, which may be processor-executable to implement any element or action described above. In one embodiment, the program instructions may implement the methods described above. In other embodiments, different elements and data may be included. Note that data may include any data or information described above.

Those skilled in the art will appreciate that computer system 1800 is merely illustrative and is not intended to limit the scope of embodiments. In particular, the computer system and devices may include any combination of hardware or software that can perform the indicated functions, including computers, network devices, Internet appliances, PDAs, wireless phones, pagers, etc. Computer system 1800 may also be connected to other devices that are not illustrated, or instead may operate as a stand-alone system. In addition, the functionality provided by the illustrated components may in some embodiments be combined in fewer components or distributed in additional components. Similarly, in some embodiments, the functionality of some of the illustrated components may not be provided and/or other additional functionality may be available.

Those skilled in the art will also appreciate that, while various items are illustrated as being stored in memory or on storage while being used, these items or portions of them may be transferred between memory and other storage devices for purposes of memory management and data integrity. Alternatively, in other embodiments some or all of the software components may execute in memory on another device and communicate with the illustrated computer system via inter-computer communication. Some or all of the system components or data structures may also be stored (e.g., as instructions or structured data) on a computer-accessible medium or a portable article to be read by an appropriate drive, various examples of which are described above. In some embodiments, instructions stored on a computer-accessible medium separate from computer system 1800 may be transmitted to computer system 1800 via transmission media or signals such as electrical, electromagnetic, or digital signals, conveyed via a communication medium such as a network and/or a wireless link. Various embodiments may further include receiving, sending or storing instructions and/or data implemented in accordance with the foregoing description upon a computer-accessible medium. Generally speaking, a computer-accessible medium may include a non-transitory, computer-readable storage medium or memory medium such as magnetic or optical media, e.g., disk or DVD/CD-ROM, volatile or non-volatile media such as RAM (e.g. SDRAM, DDR, RDRAM, SRAM, etc.), ROM, etc. In some embodiments, a computer-accessible medium may include transmission media or signals such as electrical, electromagnetic, or digital signals, conveyed via a communication medium such as network and/or a wireless link The methods described herein may be implemented in software, hardware, or a combination thereof, in different embodiments. In addition, the order of the blocks of the methods may be changed, and various elements may be added, reordered, combined, omitted, modified, etc. Various modifications and changes may be made as would be obvious to a person skilled in the art having the benefit of this disclosure. The various embodiments described herein are meant to be illustrative and not limiting. Many variations, modifications, additions, and improvements are possible. Accordingly, plural instances may be provided for components described herein as a single instance. Boundaries between various components, operations and data stores are somewhat arbitrary, and particular operations are illustrated in the context of specific illustrative configurations. Other allocations of functionality are envisioned and may fall within the scope of claims that follow. Finally, structures and functionality presented as discrete components in the example configurations may be implemented as a combined structure or component. These and other variations, modifications, additions, and improvements may fall within the scope of embodiments as defined in the claims that follow.

What is claimed is:

1. A non-transitory computer-readable medium storing program instructions, that when executed on or across one or more processors, cause the one or more processors to:
receive attribute values to be compressed, wherein the attribute values correspond to points of a set of points in three-dimensional space;
apply a transform function to the attribute values to generate corresponding transformed attribute values for the received attribute values;
determine, for each point of the set of points, whether respective values of one or more transformed attribute values associated with the respective point comprise one or more significant values or do not comprise a significant value;
assign to points that have transformed attribute values that comprise one or more significant values a first binary flag value and assign to points that have transformed attribute values that do not comprise a significant value a second binary flag value;
evaluate the binary flag values assigned to the points of the set of points to identify consecutive points assigned the first binary flag value and consecutive points assigned the second binary flag value; and
for respective runs of points having the first binary flag value as a same assigned binary flag value and for respective runs of points having the second binary flag value as a same assigned binary flag value:
encode a value indicating a length of the respective run using a variable-length encoding technique.

2. The non-transitory computer-readable medium of claim 1, wherein to encode the values indicating the lengths of the respective runs, the program instructions, when executed by the one or more processors, cause the one or more processors to:
encode the values indicating the lengths of the respective runs in an order such that the encoded values alternate between being a value corresponding to a run having the first binary flag as an assigned binary flag value and a value corresponding to a run having the second binary flag as an assigned binary flag value.

3. The non-transitory computer-readable medium of claim 1, wherein the variable-length encoding technique is a $k^{th}$ order exponential Golomb encoding technique,
wherein the program instructions, when executed by the one or more processors cause:
a first state to be maintained for determining a value of k for respective runs having the first binary flag value as a same assigned binary flag value; and
a second state to be maintained for determining a value of k for respective runs having the second binary flag value as a same assigned binary flag value, and
wherein the program instructions, when executed by the one or more processors cause:
contexts and associated probabilities to be maintained for determining pre-fix portions of Golomb code words for the $k^{th}$ order Golomb encoding technique, wherein whether a run-length value being encoded is for a respective run having the first binary flag value as a same assigned binary flag value or the second binary flag value as a same assigned binary flag value is one of the contexts that is maintained.

4. The non-transitory computer-readable medium of claim 1, wherein the variable-length encoding technique is a Golomb-Rice encoding technique.

5. The non-transitory computer-readable medium of claim 1, wherein the variable-length encoding technique is a hybrid technique that encodes smaller run-length values using a Golomb-Rice encoding technique and encodes larger run-length values using an exponential Golomb encoding technique,
wherein a transition between the different encoding techniques of the hybrid encoding technique is fixed or adaptive, wherein if adaptive an encoder and a decoder utilize a similar process to learn a boundary in run-length values for the transition.

6. The non-transitory computer-readable medium of claim 1, wherein the encoded values for the respective runs are ordered such that consecutive encoded run-length values represent runs of different valued binary flag values.

7. The non-transitory computer-readable medium of claim 1, wherein for the first run-length value encoded, an additional indication is encoded indicating whether the first encoded run-length value corresponds to a run of points with the first binary flag value as a same assigned binary flag value or a run of points with the second binary flag value as a same assigned binary flag value.

8. The non-transitory computer-readable medium of claim 7, wherein a first run-length value encoded corresponds to a fixed one of a run of points having the first binary flag value as a same assigned binary flag value or a run of points having the second binary flag value as a same assigned binary flag value,
such that a decoder can infer a type of run corresponding to the first encoded run-length value without signaling the type of run for the first encoded run-length value.

9. A device, comprising:
a memory storing program instructions for compressing attribute values associate with points of a set of points in three-dimensional space; and
one or more processors, wherein the program instructions, when executed by the one or more processors, cause the one or more processors to:
determine, for each point of the set of points, whether respective values of one or more attribute coefficients associated with the respective point comprise one or more significant values or do not comprise a significant value;
assign to points that have attribute coefficients that comprise one or more significant values a first binary flag value and assign to points that have attribute coefficients values that do not comprise a significant value a second binary flag value;
evaluate the binary flag values assigned to the points of the set of points to identify consecutive points assigned the first binary flag value and consecutive points assigned the second binary value;
for respective runs of points having the first binary flag value as a same assigned binary flag value and for respective runs of points having the second binary flag value as a same assigned binary flag value:
encode a value indicating a length of the respective run using a variable-length encoding technique.

10. The device of claim 9, wherein the program instructions, when executed by the one or more processors, cause the one or more processors to:
receive attribute values to be compressed, wherein the attribute values comprise an attribute value tuple for each point;
apply a transform function to the attribute values to generate corresponding attribute coefficients,
wherein if at least one set of coefficients for an attribute value of an attribute value tuple for a given point comprises a significant value then the program instructions cause the one or more processors to assign the given point the first binary flag.

11. The device of claim 10, wherein for points assigned the first binary flag, the program instructions, when executed by the one or more processors, cause the one or more processors to:
determine, for each individual attribute value of the attribute tuples of the points assigned the first binary flag, whether attribute coefficients for the individual attribute values of the respective attribute tuples comprises a significant value or do not comprise a significant value;
assign for the individual attribute values of the tuples, the first binary flag value if the individual attribute value comprises a significant coefficient;
assign for the individual attribute values of the tuples, the second binary flag if the individual attribute value does not comprise a significant value;
evaluate the binary flag values assigned to the individual attribute values of the tuples to identify:
consecutive individual attribute values assigned the first binary flag value; and
consecutive individual attribute values assigned the second binary flag value;
for respective runs of the individual attribute values of the tuples having the first binary flag value as a same assigned binary flag value for the respective run or having the second binary flag value as a same assigned binary flag value for the respective run:
encode a value indicating a length of the respective run using a variable-length encoding technique,
wherein the values of the lengths of the runs of the individual attribute values for points with significant attribute coefficients are encoded in addition to the values of the lengths of runs of points having attributes with or without significant attribute coefficient values.

12. The device of claim 9, wherein points whose attribute coefficient values are equal to zero are assigned the first binary flag and points with coefficient values greater than zero are assigned the second binary flag.

13. The device of claim 12, wherein for points assigned the first binary flag, the program instructions, when executed by the one or more processors, cause the one or more processors to:
determine, for each point assigned the first binary flag, whether attribute coefficients for the respective point comprise one or more values greater than one;
assign for the points with one or more attribute coefficient values greater than zero, an additional first binary flag value if the attribute coefficient values comprises one or more values greater than one;
assign for the points with one or more attribute coefficient values greater than zero, an additional second binary flag if the attribute coefficient values does not comprises one or more values greater than one;
evaluate the additional binary flag values assigned for the points, to identify consecutive points assigned the first binary flag values and consecutive points assigned the second binary flag values
for respective runs of the points assigned the first binary flag value that are additionally assigned an additional first binary flag value or are additionally assigned a second binary flag value:
encode a value indicating a length of the respective runs of the additional binary flags using a variable-length encoding technique.

14. The device of claim 9, wherein the program instructions, when executed by the one or more processors, cause the one or more processors to:
determine two or more levels of detail for the set of points whose associated attribute values are to be compressed, wherein each level of detail comprises a sub-set of the set of points;
perform said determining points with significant attribute coefficient values, for the points of each of the levels of detail;
perform said assigning binary flag values to the points based on significance of the attribute coefficient values of the points, for the points of each of the levels of detail;
perform said evaluating the binary flag values to identify consecutive points assigned a same binary flag value, for the points of each of the levels of detail; and perform said encoding values of run-lengths of the respective runs using a variable-length encoding technique, for the points of each of the levels of detail.

15. The device of claim 14, wherein the program instructions, when executed by the one or more processors, further cause the one or more processors to:
quantize the attribute coefficient values associated with the points included in the levels of detail,
wherein two or more different levels of quantization are applied to attribute coefficients of points included in two or more different ones of the levels of detail.

16. The device of claim 14, wherein the variable-length encoding technique is a $k^{th}$ order exponential Golomb encoding technique,
wherein the program instructions, when executed by the one or more processors cause:
a first state to be maintained for determining a value of k for respective runs having the first binary flag value as a same assigned binary flag value; and
a second state to be maintained for determining a value of k for respective runs having the second binary flag value as a same assigned binary flag value, and
wherein the program instructions, when executed by the one or more processors cause:
contexts and associated probabilities to be maintained for determining pre-fix portions of Golomb code words for the $k^{th}$ order Golomb encoding technique, wherein:
whether a run-length value being encoded is for a respective run having the first binary flag value as a same assigned binary flag value or the second binary flag value as a same assigned binary flag value is one of the contexts that is maintained; and
to which level of detail a set of points belongs, for which the attribute values are being encoded, is another one of the contexts that is maintained.

17. A non-transitory computer-readable medium storing program instructions, that when executed on or across one or more processors, cause the one or more processors to:
receive a sequence of encoded values, encoded using a variable length encoding technique, wherein the encoded values indicate lengths of respective runs of binary flag with a same value, wherein each binary flag value represents whether or not attribute coefficient values for attributes of a point comprise significant or non-significant values, wherein each point, of a set of points whose attribute values have been compressed, is assigned at least one binary flag value;
decode the encoded values using a variable length decoding technique to determine respective run lengths of the respective runs;
for respective runs having a first binary flag value as a same assigned binary flag value, mark the points associated with the respective runs for further processing to determine attribute coefficient values for the points of the respective runs; and
for other respective runs having a second binary flag value as a same assigned binary flag value, assign a zero value to the attribute coefficients for the points associated with the other respective runs.

18. The non-transitory, computer-readable medium of claim 17, wherein:
the first binary value assigned to points having significant coefficient values is one; and
the second binary value assigned to points having non-significant coefficient values is zero.

19. The non-transitory, computer-readable medium of claim 17, wherein the received sequence of encoded values is for a given level of detail of a plurality of levels of detail for the set of points, wherein each level of detail comprises attribute information for a sub-set of the points of the set of points,
wherein the program instructions, when executed by the one or more processors, cause the one or more processors to:
receive, for other levels of detail of the plurality of levels of detail, other sequences of encoded values indicating lengths of respective runs of binary flags with a same value;
decode, for the other levels of detail, the encoded values of the other sequences;
associate binary flag values with respective points of the other levels of detail using the decoded values; and
perform said marking of the points of the other levels of detail for further processing or said assigning a zero value to the attribute coefficients of the points of the other levels of detail based on whether or not the points of the other levels of detail are associated with the first binary flag value or the second binary flag value.

20. The non-transitory, computer-readable medium of claim 17, wherein the variable length encoding technique comprises:
an exponential Golomb encoding technique;
a Golomb-Rice encoding technique; or
a hybrid technique that encodes smaller run-length values using a Golomb-Rice encoding technique and encodes larger run-length values using an exponential Golomb encoding technique.

* * * * *